United States Patent
Park

(10) Patent No.: US 7,094,660 B2
(45) Date of Patent: Aug. 22, 2006

(54) METHOD OF MANUFACTURING TRENCH CAPACITOR UTILIZING STABILIZING MEMBER TO SUPPORT ADJACENT STORAGE ELECTRODES

(75) Inventor: Je-Min Park, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 11/043,306

(22) Filed: Jan. 25, 2005

(65) Prior Publication Data

US 2005/0161720 A1    Jul. 28, 2005

(30) Foreign Application Priority Data

Jan. 26, 2004  (KR) .................. 10-2004-0004640

(51) Int. Cl.
*H01L 21/02* (2006.01)
*H01L 21/8239* (2006.01)

(52) U.S. Cl. ............... 438/386; 438/243; 257/301; 257/E21.014

(58) Field of Classification Search ............ 438/386, 438/238, 239, 243; 257/301, 305, 296
See application file for complete search history.

(56) References Cited

U.S. PATENT DOCUMENTS

| | | | |
|---|---|---|---|
| 6,700,153 B1 * | 3/2004 | Oh et al. ............... | 257/309 |
| 2003/0085420 A1 | 5/2003 | Ito et al. | |
| 2003/0178728 A1 | 9/2003 | Park et al. | |
| 2004/0051130 A1 * | 3/2004 | Miyajima .............. | 257/301 |
| 2005/0051822 A1 * | 3/2005 | Manning ............... | 257/296 |
| 2005/0099760 A1 * | 5/2005 | Park ..................... | 361/306.3 |
| 2005/0176210 A1 * | 8/2005 | Kim et al. ............. | 438/386 |

FOREIGN PATENT DOCUMENTS

| | | |
|---|---|---|
| JP | 2003-142605 | 5/2003 |
| KR | 2003-0069272 | 8/2003 |
| KR | 2005-0052884 | 6/2005 |

OTHER PUBLICATIONS

English language abstract of Korean Publication No. 2003-0069272.
English language abstract of Japanese Publication No. 2003-142605.
English language abstract of Korean Publication No. 2005-0052884.

* cited by examiner

*Primary Examiner*—Eddie Lee
*Assistant Examiner*—Andrew O. Arena
(74) *Attorney, Agent, or Firm*—Marger Johnson & McCollom, P.C.

(57) ABSTRACT

A semiconductor device has a stabilizing member that encloses an upper portion of a storage electrode to improve structural stability. A dielectric layer and a plate electrode are successively formed on the storage electrode including a stabilizing member. Since the stabilizing member includes a protruding portion to support the storage electrode and an adjacent storage electrode, all of the storage electrodes in a unit cell of a semiconductor device are structured to prevent a collapse. Also, the semdevice can have a very high height without collapse when the capacitors have extremely high aspect ratios. Therefore, the capacitors may have greatly enhanced capacitance in comparison with a conventional capacitor.

12 Claims, 35 Drawing Sheets

METHOD OF MANUFACTURING TRENCH CAPACITOR UTILIZING STABILIZING MEMBER TO SUPPORT ADJACENT STORAGE ELECTRODES

CROSS REFERENCE TO RELATED APPLICATION

This application claims priority under 35 USC § 119 of Korean Patent Application No. 2004-4640, filed on Jan. 26, 2004, the contents of which are incorporated herein by reference in their entirety.

BACKGROUND OF THE INVENTION

1. Field of the Invention

The present invention relates to a semiconductor device and a method of manufacturing the semiconductor device. More particularly, the present invention relates to a capacitor having an improved structural stability and a method of manufacturing the capacitor.

2. Description of the Related Art

In general, semiconductor memory devices such as dynamic random access memory (DRAM) devices or static random access memory (SRAM) devices can store data or information therein. The data or information is stored in the semiconductor memory devices, and also the data or information is read from the semiconductor memory devices. A typical single unit memory cell of the semiconductor memory device includes one capacitor and one transistor. The capacitor of the semiconductor memory device generally has a storage electrode, a dielectric layer, and a plate electrode. To improve the storage capacity of the semiconductor memory device, the capacitor needs a large capacitance.

As the degree of integration of the semiconductor memory device has increased, the unit memory cell of the semiconductor memory device has continuously decreased in area. To ensure a sufficient storage capacitance of the semiconductor memory device, the capacitor may have various shapes, such as a box, a fin, a crown, a cylinder, etc. However, due to design constraints of the semiconductor memory device that include size decreases, the capacitor should have an increasingly large aspect ratio, defined as the ratio of the height to the width of the capacitor. Thus the capacitor may have sufficient capacitance when formed in a limited unit area of the semiconductor memory device. As a result, however, the capacitors having a high aspect ratio may mechanically collapse so that a so-called two-bit failure may occur between adjacent capacitors.

FIG. 1 is a schematic cross-sectional view illustrating conventional cylindrical capacitors.

Referring to FIG. 1, a conventional capacitor includes a cylindrical storage electrode 13 connected to a contact pad 4 formed on a semiconductor substrate 1. The cylindrical storage electrode 13 is electrically connected to the contact pad 4 by a contact plug 10 formed in an insulation layer 7 that covers the semiconductor substrate 1. To increase the storage capacitance of the semiconductor memory device, the cylindrical storage electrode 13 of the capacitor has a greatly increased height. When the cylindrical storage electrode 13 has this greatly increased height, the cylindrical storage electrode 13 may collapse toward an adjacent cylindrical electrode so that adjacent capacitors may be inadvertently connected to each other. This is shown in FIG. 1 by dashed cylindrical storage electrode 13. The collapse of the cylindrical storage electrode 13 is referred to as a two-bit failure. When the two-bit failure occurs in the semiconductor memory device, the semiconductor memory device may not properly operate.

Accordingly, U.S. Patent Application Publication No. 2003/85420 discloses a semiconductor device including a beam-shaped insulating member between capacitors of the semiconductor device to improve the mechanical strength of the capacitor.

FIG. 2A is a cross-sectional view illustrating the semiconductor device including the beam-shaped insulating member, and FIG. 2B is a plan view illustrating the semiconductor device in FIG. 2A.

Referring to FIGS. 2A and 2B, after a semiconductor substrate 15 is divided into an active region and a field region by forming an isolation layer 18 on the semiconductor substrate 15, gate structures 27 are formed in the active region of the semiconductor substrate 15. Each of the gate structures 27 includes a gate oxide layer pattern, a gate electrode and a mask pattern.

Impurities are implanted into portions of the semiconductor substrate 15 by an ion implantation process using the gate structures 27 as masks, forming source/drain regions 21 and 24 at the portions of the substrate 15 between the gate structures 27. Thus, metal oxide semiconductor (MOS) transistors are formed on the semiconductor substrate 15.

After a first insulating interlayer 42 is formed on the substrate 15 to cover the MOS transistors, capacitor plugs 30 and a bit line plug 33 are formed through the first insulating interlayer 42. The capacitor plugs 30 and the bit line plug 33 are connected to the source/drain regions 21 and 24, respectively.

After a second insulating interlayer 45 is formed on the first insulating interlayer 42, the second insulating interlayer 45 is partially etched to form a bit line contact plug 36 making contact with the bit line plug 33.

A third insulating interlayer 48 is formed on the second insulating interlayer 45. The third and second insulating interlayers 48 and 45 are successively etched to form capacitor contact plugs 39 making contact with the capacitor plugs 30, respectively.

After an etch stop layer 51 is formed on the third insulating interlayer 48 and the capacitor contact plugs 39, holes 54 exposing the capacitor contact plugs 39 are formed through the etch stop layer 51. Cylindrical bottom electrodes 57 making contact with the capacitor contact plugs 39 are formed in the holes 54, respectively. Here, the cylindrical bottom electrodes 57 are electrically connected to the source/drain regions 21 and 24 by the capacitor contact plugs 39 and the capacitor plugs 30.

After beam-shaped insulating members 72 are formed between sidewalls of adjacent bottom electrodes 57, dielectric layers 60 and top electrodes 63 are successively formed on the bottom electrodes 57 to thereby form capacitors 66 on the semiconductor substrate 15.

An additional insulation layer 69 is formed over the substrate 15 to cover the capacitors 66. Since the beam-shaped insulating members 72 are formed between the sidewalls of the adjacent bottom electrodes 57, the mechanical strength of the capacitor 66 may be improved.

However, in the above-described semiconductor device, processes for manufacturing the semiconductor device are complicated because at least four beam-shaped insulating members 72 should be formed between the adjacent bottom electrodes 57 to improve the mechanical strength of the capacitor 66. Thus, manufacturing cost and manufacturing time for the semiconductor device is increased. Additionally, the manufacturing processes are more complicated because the capacitor 66 has a complex structure including the bottom electrode 57, the beam-shaped insulating members 72, the dielectric layer 60 and the top electrode 63 as shown in FIGS. 2A and 2B. Further, the additional insulation layer 69 may not be precisely formed between the capacitors 66 having the complex structure so that the capacitors 66 may be inadvertently electrically connected to an upper wiring formed on the capacitors 66. As a result, the processes for manufacturing the semiconductor device including the capacitor 66 having the complex structure may have poor throughput.

SUMMARY OF THE INVENTION

The present invention provides a semiconductor device with an improved structural stability in accordance with a simple stabilizing member and an extended effective area thereof.

The present invention also provides a method of manufacturing a semiconductor device having an improved structural stability.

In the present invention, since stabilizing members are provided to greatly improve structural stabilities of the capacitors, the capacitors may have very high height without collapse when the capacitors have extremely high aspect ratios. Therefore, the capacitors may have greatly enhanced capacitance in comparison with a conventional capacitor.

In accordance with one embodiment of the present invention, a semiconductor device includes a storage electrode, a dielectric layer formed on the storage electrode, a plate electrode formed on the dielectric layer and a stabilizing member enclosing an upper portion of the storage electrode. The stabilizing member includes a protruding portion for supporting the storage electrode and an adjacent storage electrode. The stabilizing member is separated from one adjacent stabilizing member along a parallel direction relative to a direction where the storage electrode and the adjacent electrode are arranged. In addition, the stabilizing member is connected to another adjacent stabilizing member along a right diagonal direction, a left diagonal direction, or both, relative to the direction where the storage electrode and the adjacent electrode are arranged. Here, the protruding portion of the stabilizing member is horizontally formed along the right diagonal direction, the left diagonal direction, or both. The storage electrode has a cylindrical shape of which upper portion is substantially wider than a lower portion thereof, and also the stabilizing member has an upper portion substantially wider than a lower portion thereof.

In accordance with another embodiment of the present invention, there is provided a method of manufacturing a semiconductor device. In the method of manufacturing the semiconductor device, at least one first mold layer is formed on a semiconductor substrate after a contact region is formed at a surface portion of a semiconductor substrate. A first insulation layer and a second mold layer are sequentially formed on the first mold layer. A first opening is formed by partially etching the second mold layer, the first insulation layer and the first mold layer. After a stabilizing member is formed on an inner sidewall of the first opening, a contact hole is formed to expose an inner sidewall of the stabilizing member and the contact region. The stabilizing member has a protruding portion for supporting adjacent storage electrodes. A storage electrode contacting the contact region is formed on the inner sidewall of the stabilizing member and an inner sidewall of the contact hole. A dielectric layer and a plate electrode are successively formed on the storage electrode. The first insulation layer has an etching selectivity relative to the first and second mold layers so that the first insulation layer is rapidly etched in comparison with the first and second mold layers using an etching solution including hydrogen fluoride or an etching solution including ammonium hydroxide, hydrogen peroxide and deionized water. To form the stabilizing member, a mask layer is formed on the second mold layer and a mask is formed on the second mold layer by patterning the mask layer. After the first opening is formed by partially etching the second mold layer, the first insulation layer and the first mold layer using the mask, a second opening is formed by extending the first opening. A second insulation layer is formed on the mask and an inner sidewall and a bottom of the second opening, the second insulation layer is partially etched to form the stabilizing member on the inner sidewall of the second opening. Here, the first opening is formed by an anisotropic etching process, and the second opening is formed by an isotropic etching process. The second opening is partially connected to an adjacent second opening along a right diagonal direction, a left diagonal direction, or both, relative to the contact region. Also, a portion of the first insulation layer is completely removed along the right diagonal direction, left diagonal direction while the second opening is formed.

BRIEF DESCRIPTION OF THE DRAWINGS

The above and other features and advantages of the present invention will become readily apparent by reference to the following detailed description when considered in conjunction with the accompanying drawings.

DESCRIPTION OF THE PREFERRED EMBODIMENTS

Figure 1:
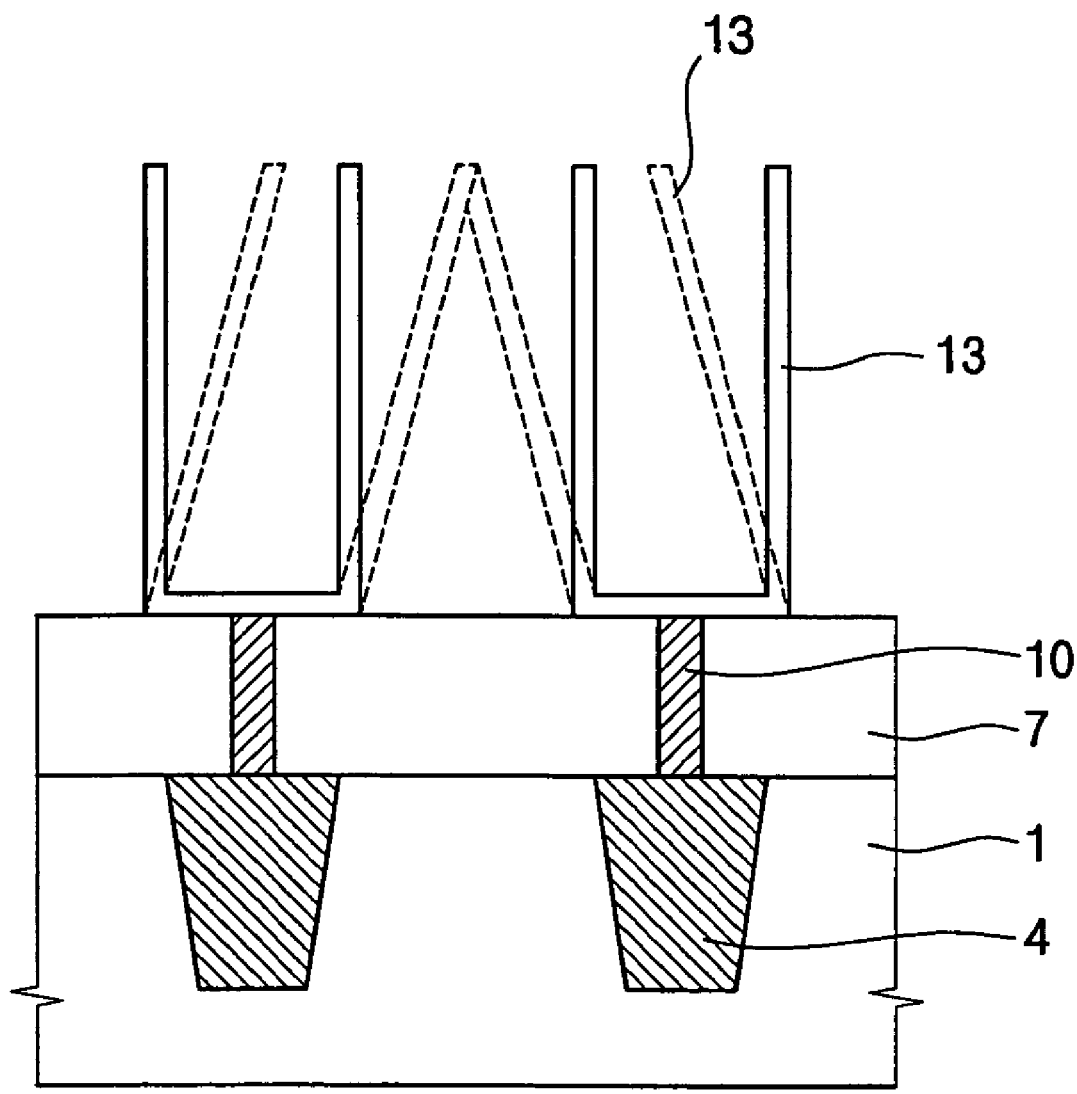
FIG. 1 is a schematic cross-sectional view illustrating conventional cylindrical capacitors.
Figure 2A:
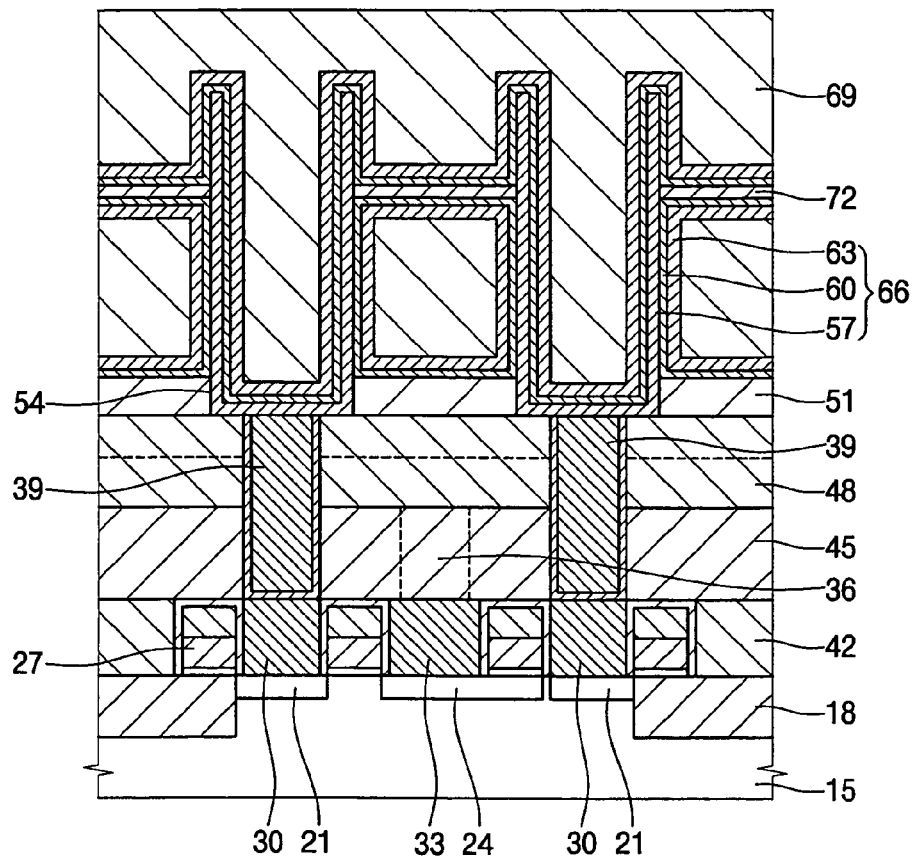
FIG. 2A is a cross-sectional view illustrating a conventional semiconductor device including a beam-shaped insulating member.
Figure 2B:
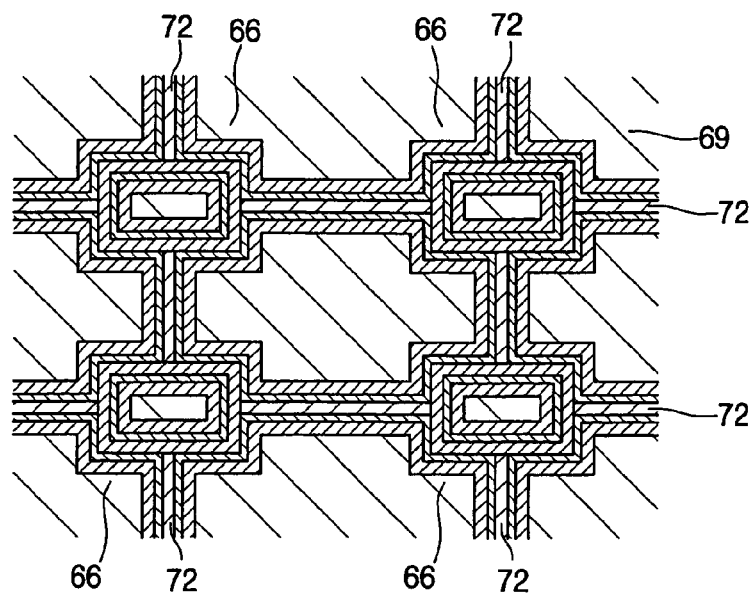
FIG. 2B is a plan view illustrating the semiconductor device in FIG. 2A.

The present invention now will be described more fully hereinafter with reference to the accompanying drawings, in which embodiments of the invention are shown. In the drawings, the thickness of layers and regions are exaggerated for clarity. Like reference numerals refer to similar or identical elements throughout. It will be understood that when an element such as a layer, a region, or a substrate is referred to as being "on" or "onto" another element, it can be directly on the other element or intervening elements may also be present.

Figure 3A:
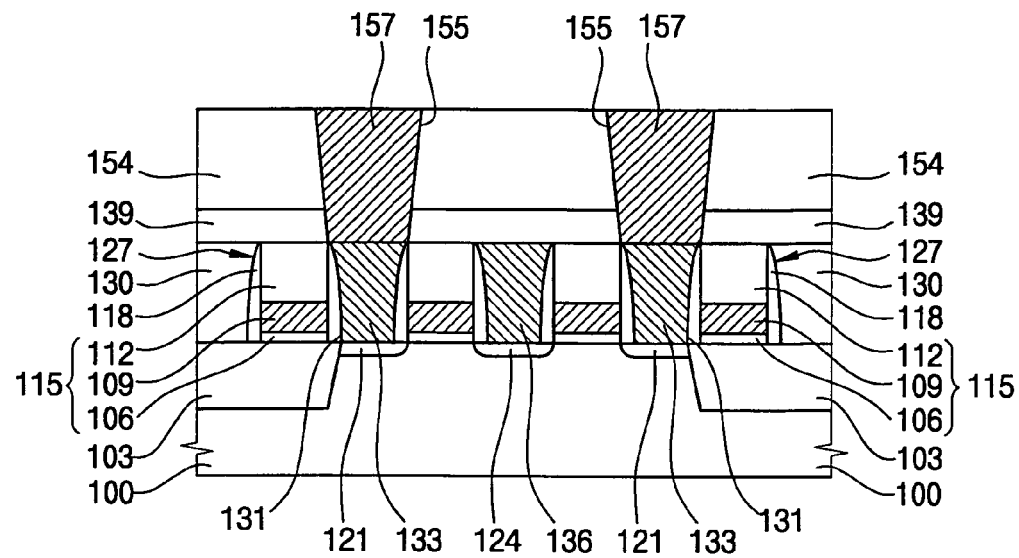
FIGS. 3A, 4A, 5B, 6B, 7B, 8A, 9A, 10B and 11A are cross-sectional views illustrating an embodiment of a semiconductor device including a capacitor along a first direction in accordance with one embodiment of the present invention.
Figure 3B:
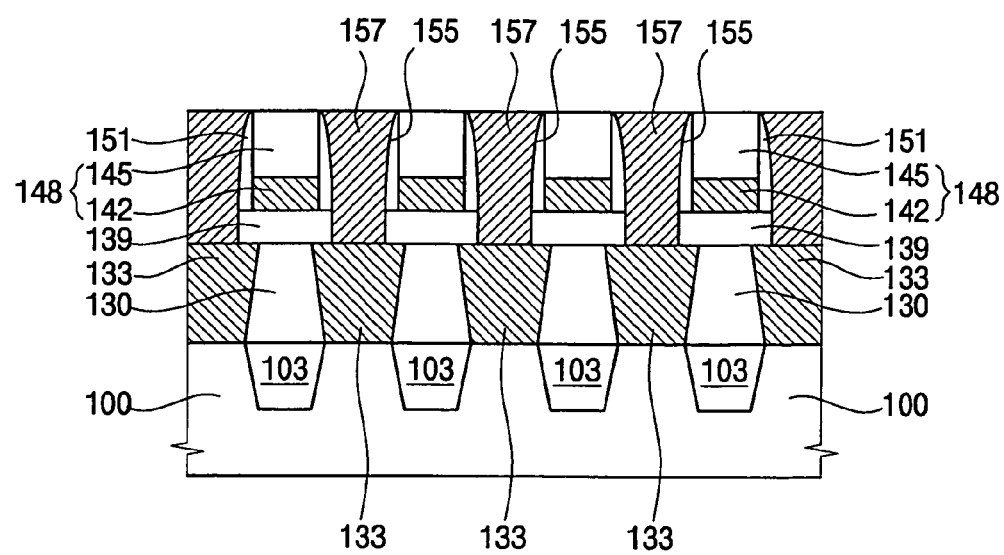
FIGS. 3B, 4B, 5C, 6C, 7C, 8B, 9B, 10C and 11B are cross-sectional views illustrating the semiconductor device including a capacitor along a second direction in accordance with one embodiment of the present invention.

FIGS. 3A and 3B are cross-sectional views illustrating processing steps of forming underlying structures on a semiconductor substrate 100.

Referring to FIGS. 3A and 3B, the semiconductor substrate 100 is divided into an active region and a field region by forming an isolation layer 103 in the semiconductor substrate 100. The isolation layer 103 may be formed by an isolation process such as a shallow trench isolation (STI) process or a local oxidation of silicon (LOCOS) process.

A thin gate oxide layer (not shown) is formed on the semiconductor substrate 100 by a thermal oxidation process or a chemical vapor deposition (CVD) process. The thin gate oxide layer is formed on the active region only. The gate oxide layer will be partially etched to form a gate oxide pattern 106 on the substrate 100.

A first conductive layer (not shown) and a first mask layer (not shown) are successively formed on the gate oxide layer. The first conductive layer and the first mask layer correspond to a gate conductive layer and a gate mask layer, respectively. The first conductive layer may include polysilicon doped with impurities. The first conductive layer will be patterned to form the gate conductive pattern 109 on the gate oxide pattern 106. Alternatively, the first conductive layer has a polycide structure that includes a doped polysilicon film and a metal silicide film formed on the doped polysilicon film. The first mask layer is formed using a material that has an etching selectivity relative to the first insulating interlayer 130. For example, the first mask layer is formed using nitride such as silicon nitride when the first insulating interlayer 130 includes oxide. The first mask layer will be patterned to form a gate mask pattern 112 on the gate conductive pattern 109.

After a first photoresist film (not shown) is formed on the first mask layer, the first photoresist film is exposed and developed to form a first photoresist pattern (not shown) on the first mask layer. The first mask layer, the first conductive layer and the gate oxide layer are partially etched using the first photoresist pattern as an etching mask to form gate structures 115 on the semiconductor substrate 100. Each of the gate structures 115 includes the gate oxide pattern 106, the gate conductive pattern 109 and the gate mask pattern 112. That is, the first mask layer, the first conductive layer, and the gate oxide layer are successively etched, thereby forming the gate structures 115 on the semiconductor substrate 100.

In one embodiment of the present invention, the first mask layer is etched using the photoresist pattern as an etching mask so that the gate mask pattern 112 is formed on the first conductive layer. After the first photoresist pattern is removed from the gate mask pattern 112 by an ashing process, a stripping process, or both, the first conductive layer and the gate oxide layer are successively etched using the gate mask pattern 112 as an etching mask. As a result, the gate structures 115, including the gate oxide patterns 106, the gate conductive patterns 109, and the gate mask patterns 112, are formed on the semiconductor substrate 100.

A first insulation layer is formed on the semiconductor substrate 100 to cover the gate structures 115. The first insulation layer may be formed using nitride such as silicon nitride. The first insulation layer is anisotropically etched to form first spacers 118 on sidewalls of the gate structures 115, respectively. The first spacers 118 correspond to gate spacers.

Impurities are implanted into surfaces of the semiconductor substrate 100 that are exposed between the gate structures 115 that have the first spacers 118 by using the gate structures 115, including the first spacers 118, as masks by an ion implantation process. Afterwards, the implanted impurities are thermally treated to form first contact regions 121 and second contact regions 124 at the exposed portion of the semiconductor substrate 100. The first and second contact regions 121 and 124 correspond to source/drain regions of transistors, respectively. As a result, a plurality of word lines 127 is formed on the semiconductor substrate 100. The word lines 127 include MOS transistors having the gate structures 115 and the first and second contact regions 121 and 124. Here, adjacent word lines 127 are electrically separated by the first spacers 118 and the gate mask patterns 112 thereof. The first and second contact regions 121 and 124 also correspond to capacitor contact regions and bit line contact regions, respectively. Capacitors 205 (see FIG. 11A) are electrically connected to the capacitor contact regions, whereas bit lines 148 are electrically connected to the bit line contact regions. For example, the first contact regions 121 may be the capacitor contact regions with which the first pads 133 make contact, whereas the second contact regions 124 may be the bit line contact regions with which the second pads 136 make contact.

In one embodiment of the present invention, before forming the first spacers 118 on the sidewalls of the gate structures 115, first impurities of relatively low concentration are primarily implanted into the exposed portions of the substrate 100 between the gate structures 115. Then, second impurities of relative high concentration are secondarily implanted into the exposed portion of the substrate 100 after forming the first spacers 118. As a result, the first and second contact regions 121 and 124 having lightly doped drain (LDD) structures are formed at the exposed portion of the substrate 100.

Referring now to FIGS. 3A and 3B, the first insulating interlayer 130 is formed on the semiconductor substrate 100 to cover the word lines 127. The first insulating interlayer 130 may include oxide such as boro-phosphor silicate glass (BPSG), phosphor silicate glass (PSG), undoped silicate glass (USG), spin on glass (SOG), plasma enhanced-tetra-ethylorthosilicate (PE-TEOS) oxide, high density plasma-chemical vapor deposition (HDP-CVD) oxide and so on.

The first insulating interlayer 130 is planarized by a chemical mechanical polishing (CMP) process, an etch back process, or a combination process of CMP and etch back. Here, the planarized first insulating interlayer 130 has a predetermined thickness on upper faces of the word lines 127. Alternatively, the first insulating interlayer 130 is etched until the upper faces of the word lines 127 are exposed.

After a second photoresist film (not shown) is coated on the planarized first insulating interlayer 130, the second photoresist film is exposed and developed to form a second photoresist pattern (not shown) on the first insulating interlayer 130.

Using the second photoresist patterns as an etching mask, the first insulating interlayer 130 is partially etched to form first contact holes 131, exposing the first and second contact regions 121 and 124, respectively. Preferably, the first insulating interlayer 130 of oxide is etched using an etching gas that has an etching selectivity relative to the gate mask pattern 112 of nitride. Hence, the first contact holes 131 are formed through the first insulating interlayer 130 by a self-alignment process. That is, the first contact holes 131 are self-aligned relative to the word lines 127 including the first spacers 118. Here, some first contact holes 131 expose the first contact regions 121 corresponding to the capacitor contact regions, and other first contact holes 131 expose the second contact regions 124 corresponding to the bit line contact regions.

After removing the second photoresist pattern by an ashing process, a stripping process, or both, a second conductive layer (not shown) is formed on the first insulating layer 130 to fill the first contact holes 131. The second conductive layer may be formed using conductive material such as doped polysilicon or metal.

The second conductive layer is etched by a CMP process, an etch back process, or a combination process of CMP and etch back until the first insulating interlayer 130 is exposed. Thus, the first and second pads 133 and 136 filling the first contact holes 131 are formed on the first and second contact regions 121 and 124, respectively. Each of the first pads 133 corresponds to a first storage node contact pad, and each of the second pads 136 corresponds to a first bit line contact pad. Since the first contact holes 131 are formed by the self-alignment process, the first and second pads 133 and 136 correspond to self-aligned contact (SAC) pads. As described above, the first pads 133 make contact with the first contact regions 121 corresponding to the capacitor contact region, and the second pads 136 make contact with the second contact regions 124 corresponding to the bit line contact regions.

In one embodiment of the present invention, when the first insulating interlayer 130 is planarized until the upper faces of the word lines 127 are exposed, the second conductive layer is etched until the upper faces of the word lines 127 are exposed so that the first and second pads 133 and 136 are formed in the first contact holes 131. Here, the first and second pads 133 and 136 have heights that are substantially the same as those of the word lines 127.

Referring now to FIGS. 3A and 3B, a second insulating interlayer 139 is formed on the first insulating interlayer 130, including the first and second pads 133 and 136. The second insulating interlayer 139 electrically isolates the first pads 133 from the bit lines 148 that are successively formed on the second insulating interlayer 139. The second insulating interlayer 139 may be formed using BPSG, PSG, SOG, USG, PE-TEOS, HDP-CVD oxide, etc. Note that the second insulating interlayer 139 may be formed using one of BPSG, PSG, SOG, USG, PE-TEOS, and HDP-CVD, either identical to, or different from, that of the first insulating interlayer 130.

The second insulating interlayer 139 is planarized by a CMP process, an etch back process, or a combination process of CMP and etch back to ensure a process margin of a subsequent photolithography process.

After a third photoresist film (not shown) is formed on the planarized second insulating interlayer 139, the third photoresist film is exposed and developed to form a third photoresist pattern (not shown) on the second insulating interlayer 139.

The second insulating layer 139 is partially etched using the third photoresist pattern as an etching mask to form second contact holes (not shown) that expose the second pads 136 corresponding to the first bit line contact pads. The second contact holes correspond to bit line contact holes that electrically connect the second pads 136 to the bit lines 148, respectively.

In one embodiment of the present invention, a first anti-reflective layer (ARL) is additionally formed between the second insulating interlayer 139 and the third photoresist film to efficiently ensure the process margin of the photolithography process. The first ARL may be formed using silicon oxide, silicon nitride or silicon oxynitride. Then, the photolithography process may be carried out to form the second contact holes through the second insulating interlayer 139.

After removing the third photoresist pattern by an ashing process, a stripping process, or both, a third conductive layer (not shown) and a second mask layer (not shown) are successively formed on the second insulating interlayer 139. Here, the second contact holes are filled with the third conductive layer. The third conductive layer and the second mask layer are patterned to form bit line conductive patterns 142 and bit line mask patterns 145, respectively.

After a fourth photoresist film (not shown) is coated on the second mask layer, the fourth photoresist film is exposed and developed to form a fourth photoresist pattern (not shown) on the second mask layer. Using the fourth photoresist pattern as an etching mask, the second mask layer and the third conductive layer are subsequently etched to form the bit lines 148 on the second insulating interlayer 139. Here, third pads filling up the second contact holes are simultaneously formed. Each of the bit lines 148 includes the bit line mask pattern 145 and the bit line conductive pattern 142. The third pads correspond to second bit line contact pads that electrically connect the second pads 136 to the bit lines 148. Additionally, the third pads correspond to bit line contact plugs.

Each of the bit line conductive patterns 142 may include a first film, along with a second film that is formed on the first film. The first film may include a metal and metal compound such as titanium/titanium nitride (Ti/TiN), and the second film may include metal such as tungsten (W). Each of the bit line mask patterns 145 protects the bit line conductive patterns 142 in an etching process to form a storage contact hole 192 (see FIGS. 8A and 8B). The bit line mask pattern 145 is formed using material that has an etching selectivity relative to oxide included in a fourth insulating interlayer 160, a first mold layer 166, and a second mold layer 172 (see FIGS. 4A and 4B). For example, the bit line mask pattern 145 is formed using nitride such as silicon nitride.

In an embodiment of the present invention, the second mask layer is patterned using the fourth photoresist pattern as an etching mask to form the bit line mask patterns 145 on the third conductive layer. Then, after removing the fourth photoresist pattern, the third conductive layer is patterned using the bit line mask patterns 145 as etching masks to thereby form the bit line conductive patterns 142 on the second insulating interlayer 139. Here, the third pads are simultaneously formed in the second contact holes to electrically connect the bit line conductive patterns 142 to the second pads 136, respectively.

In one embodiment of the present invention, after an additional conductive layer is formed on the second insulating interlayer 139 to fill the second contact holes, the additional conductive layer is etched until the second insulating interlayer 139 is exposed. Hence, the third pads making contact with the second pads 136 are formed in the second contact holes. Subsequently, the third conductive layer and the second mask layer are formed on the second insulating interlayer 139 including the third pads. The third conductive layer and the second mask layer are patterned to form the bit lines 148 as described above. In particular, a barrier metal layer and a metal layer are successively formed on the second insulating interlayer 139 to fill the second contact holes. The barrier metal layer may be formed using titanium/titanium nitride, and the metal layer may be formed using tungsten. The metal and barrier metal layers are etched by a CMP process, an etch back process, or a combination process of CMP and etch back until the second insulating interlayer 139 is exposed. Thus, the third pads are formed in the second contact holes. After the third conductive layer and the second mask layer are formed on the second insulating interlayer 139 and on the third pads, the third conductive layer and the second mask layer are patterned to form the bit lines 148 including the bit line conductive patterns 142 and the bit line mask patterns 145. Here, each of the bit line conductive patterns 142 includes one metal layer of tungsten.

Referring to FIGS. 3A and 3B, a second insulation layer (not shown) is formed on the second insulating interlayer 139 to cover the bit lines 148. The second insulation layer is anisotropically etched to form second spacers 151 on sidewalls of the bit lines 148. The second spacers 151 correspond to bit line spacers. The second spacers 151 protect the bit lines 148 in a subsequent etching process for forming the fourth pads 157 that correspond to second storage node contact pads. The second spacers 151 may include material that has etching selectivity relative to the second insulating interlayer 139 and a third insulating interlayer 154 that is successively formed. For example, the second spacers 151 may include nitride such as silicon nitride.

The third insulating interlayer 154 is formed on the second insulating interlayer 139 to cover the bit lines 148 including the second spacers 151. The third insulating interlayer 154 may be formed using BPSG, PSG, PE-TEOS, USG, SOG, HDP-CVD oxide, etc. As described-above, the third insulating interlayer 154 may be formed using material identical to that of the second insulating interlayer 139, that of the first insulating interlayer 130, or that of both. Alternatively, the third insulating interlayer 154 may include material different from that of the second insulating interlayer 139, the first insulating interlayer 130, or both. Preferably, the third insulating interlayer 154 may be formed using HDP-CVD oxide that may advantageously fill gaps between the bit lines 148 without voids therein and may be formed at a low temperature.

The third insulating interlayer 154 is etched by a CMP process, an etch back process, or a combination process of CMP and etch back until the upper faces of the bit lines 148 are exposed, thereby planarizing the third insulating interlayer 154.

In an embodiment of the present invention, the third insulating interlayer 154 may be planarized without exposure of the bit lines 148. Here, the third insulating interlayer 154 has a predetermined height relative to the upper faces of the bit lines 148.

In an embodiment of the present invention, to prevent generation of voids in the third insulating interlayer 154 between adjacent bit lines 148, an additional insulation layer may be formed on the second insulating interlayer 139, including the bit lines 148. Then, the third insulating interlayer 154 is formed on the additional insulation layer. Here, the additional insulation layer may have a thickness of about 50 to about 200 Å. The additional insulation layer may be formed using nitride.

After a fifth photoresist film (not shown) is formed on the planarized third insulating interlayer 154, the fifth photoresist film is exposed and developed to form a fifth photoresist pattern (not shown) on the third insulating interlayer 154.

The third insulating interlayer 154 and the second insulating interlayer 139 are partially etched using the fifth photoresist pattern as an etching mask. Third contact holes 155 are formed through the third insulating interlayer 154 and the second insulating interlayer 139. The third contact holes 155 expose the first pads 133 corresponding to the first storage node contact pads. The third contact holes 155 correspond to first storage node contact holes. Here, the third contact holes 155 are self-aligned relative to the second spacers 151 positioned on the sidewalls of the bit lines 148.

In an embodiment of the present invention, a second ARL layer may be additionally formed on the third insulating interlayer 154 to ensure a process margin of a subsequent photolithography process.

In another embodiment of the present invention, after forming the third contact holes 155 corresponding to the first storage node contact holes, an additional cleaning process may be performed on the semiconductor substrate 100, including the resultant structure. As a result, a native oxide layer or various particles existing on the first pads 133 may be removed from the first pads 133.

After a fourth conductive layer (not shown) is formed on the third insulating interlayer 154 to fill the third contact holes 155, the fourth conductive layer is etched by a CMP process, an etch back process, or a combination process of CMP and etch back. Thus, the fourth pads 157 filling the third contact holes 155 are formed. The fourth pads 157 correspond to second storage node contact pads. The fourth pads 157 are generally formed using doped polysilicon. Each of the fourth pads 157 electrically connects the first pad 133 to a storage electrode 196 (see FIGS. 9A and 9B) successively formed on the fourth pad 157. Hence, the storage electrodes 196 are electrically connected to the first pads 133 through the fourth pads 157.

Figure 4A:
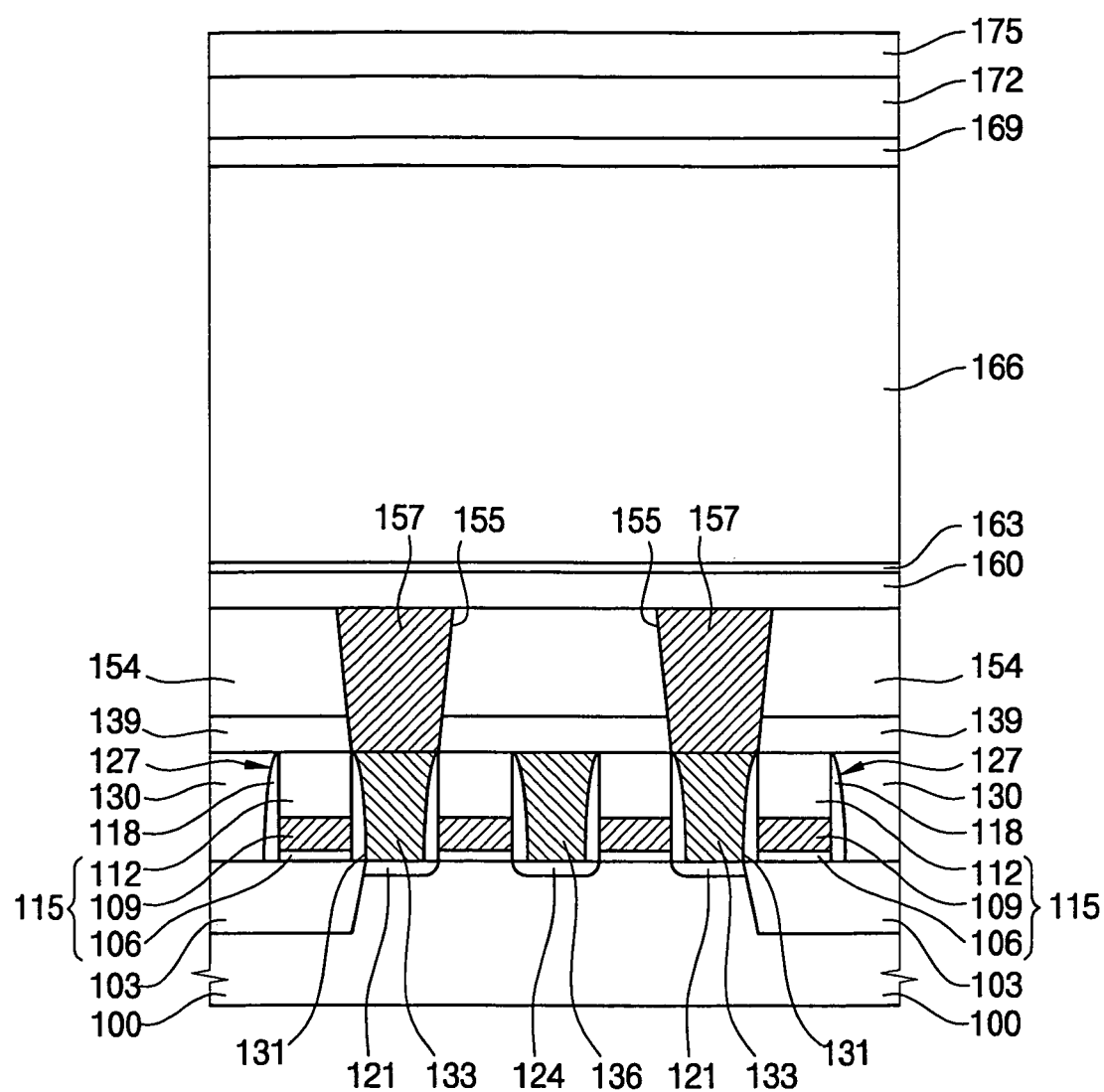
Figure 4B:
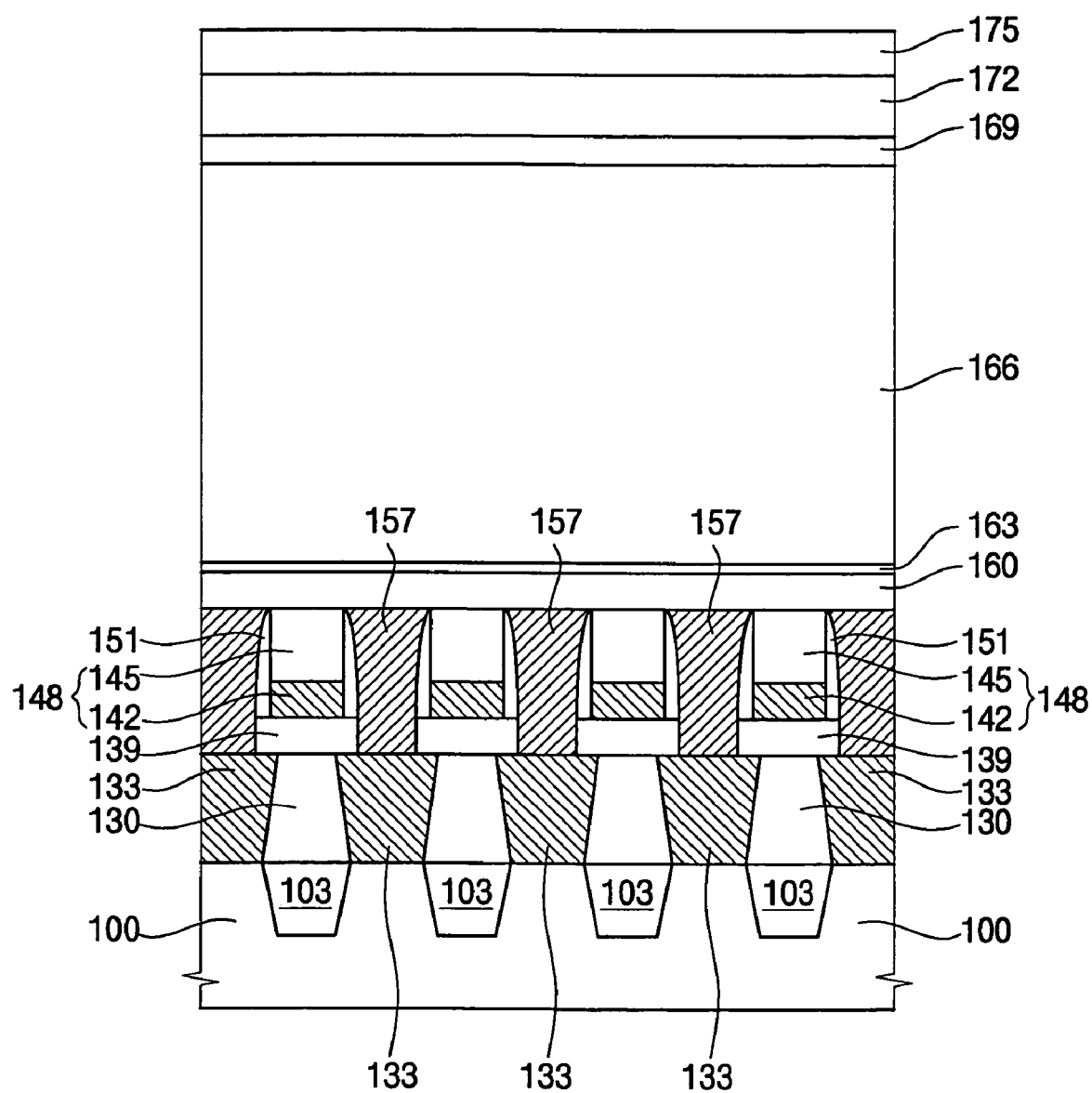

FIGS. 4A and 4B are cross sectional views illustrating processing steps of forming the fourth insulating interlayer 160, an etch stop layer 163, the first mold layer 166, a third insulation layer 169, the second mold layer 172 and a third mask layer 175.

Figure 9A:
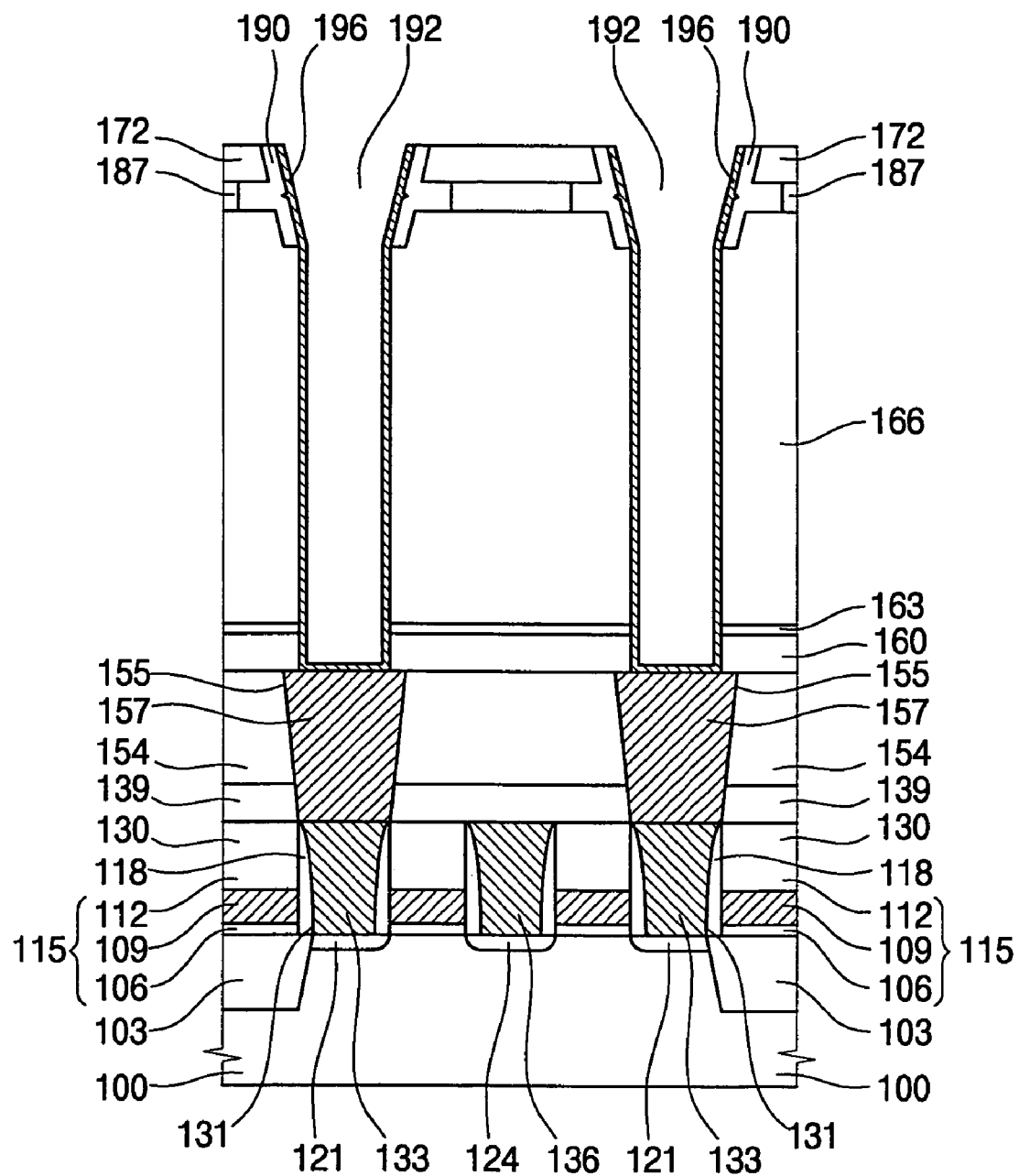
Figure 9B:
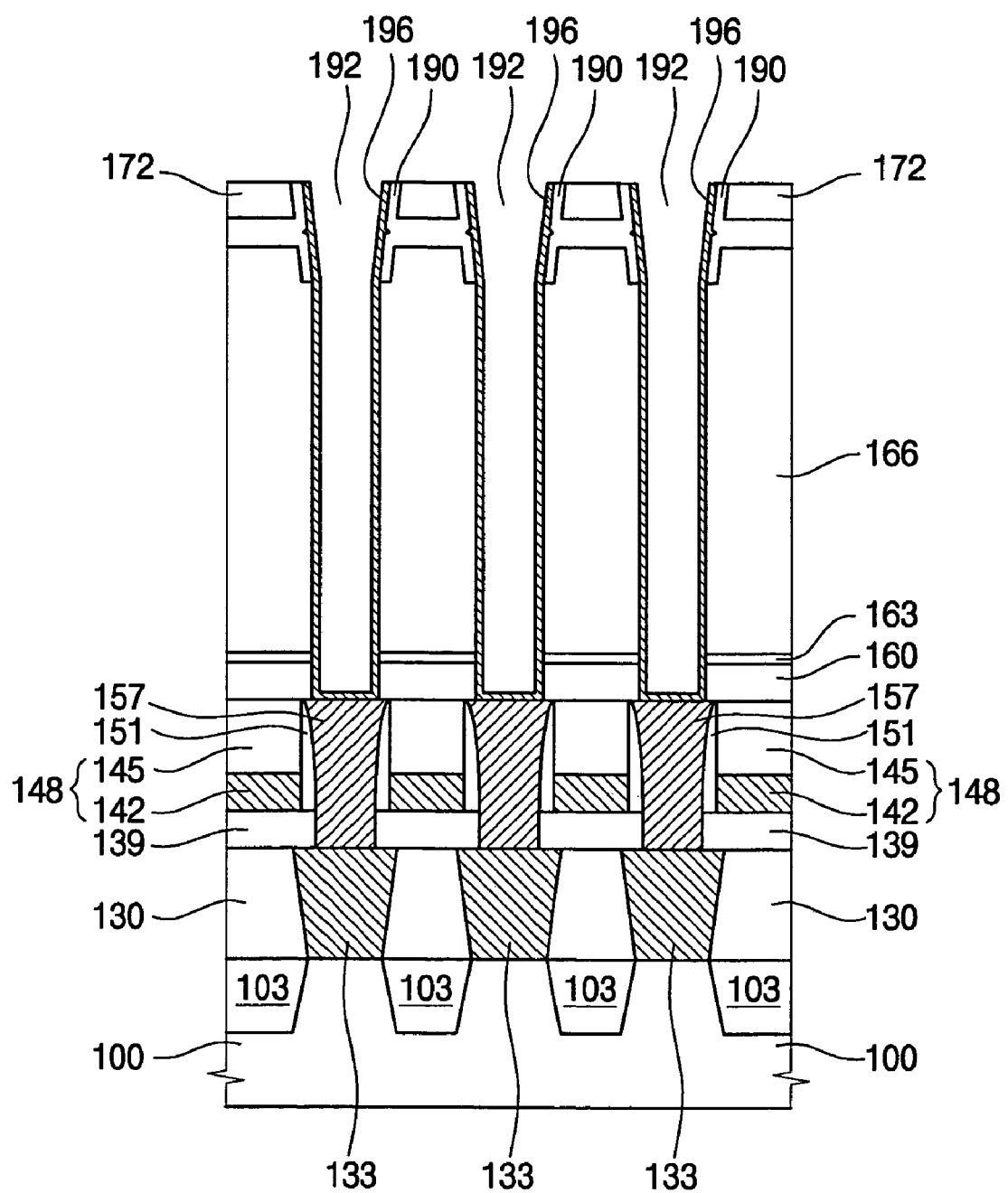

Referring to FIGS. 4A and 4B, the fourth insulating interlayer 160 is formed on the third insulating interlayer 154 and on the fourth pads 157. The fourth insulating interlayer 160 may be formed using BPSG, PSG, SOG, USG, PE-TEOS, HDP-CVD oxide, etc. The fourth insulating interlayer 160 electrically isolates the bit lines 148 from the storage electrodes 196, as can be seen in FIGS. 9A and 9B. As described above, the fourth insulating interlayer 160 may be formed using material substantially identical to that of the third insulating interlayer 154, that of the second insulating interlayer 139, or that of both. In addition, the fourth insulating interlayer 160 may be formed using material different from that of the third insulating interlayer 154, that of the second insulating interlayer 139, or that of both.

The etch stop layer 163 is formed on the fourth insulating interlayer 160. The etch stop layer 163 may be formed using material that has an etching selectivity relative to the fourth insulating interlayer 160 and the first mold layer 166. For example, the etch stop layer 163 includes nitride such as silicon nitride. The fourth insulating interlayer 160 may be planarized by a CMP process, an etch back process, or a combination process of CMP and etch back. After this planarizing process, the etch stop layer 163 may be formed on the planarized fourth insulating interlayer 160.

To form the storage electrode 196, the first mold layer 166 is formed on the etch stop layer 163. The mold layer 166 may be formed using HDP-CVD oxide, plasma enhanced TEOS (PE-TEOS), USG, BPSG, PSG, etc. The first mold layer 166 has a thickness of about 5,000 to about 50,000 Å, measured from an upper face of the etch stop layer 163. According to an embodiment of the present invention, the thickness of the first mold layer 166 may vary in accordance with desired capacitance of capacitors 205 (see FIGS. 11A and 11B). That is, because the capacitors 205 have a height in proportion to the thickness of the first mold layer 166, the thickness of the first mold layer 166 may be advantageously adjusted to control the capacitance of the capacitors 205.

In an embodiment of the present invention, since stabilizing members 190 (see FIGS. 7A to 7C) are provided to greatly improve structural stability of the capacitors 205, the capacitors 205 may have very high height without collapse. In other words, although the capacitors 205 of the present invention may have extremely high aspect ratio, the capacitors 205 may not mechanically collapse toward each other because the stabilizing members 190 are positioned at upper potions of the capacitors 205, respectively. Therefore, each of the capacitors 205 may have greatly enhanced capacitance in comparison with a conventional capacitor. The stabilizing members 190 will be described in detail.

Referring to FIGS. 4A and 4B, the third insulation layer 169 is formed on the first mold layer 166. The third insulation layer 169 has a thickness of about 100 to about 6,000 Å, measured from an upper face of the first mold layer 166. The third insulation layer 169 may be formed using material that has an etching selectivity relative to the first and second mold layers 166 and 172. For example, the third insulation layer 169 is formed using BPSG or PSG when the first and second mold layers 166 and 172 are formed using TEOS or HDP-CVD oxide. Therefore, the third insulation layer 169 may be rapidly etched in comparison with the first and second mold layers 166 and 172, using an etching solution containing hydrogen fluoride (HF) or and etching solution containing ammonium hydroxide, hydrogen peroxide and deionized water.

The second mold layer 172 is formed on the third insulation layer 169 using PE-teos, HDP-CVD oxide, PSG, USG, BPSG, SOG, etc. For example, the second mold layer 172 is formed using PE-TEOS to have a thickness of about 1,000 to about 6,000 Å, measured from an upper face of the third insulation layer 169.

The third mask layer 175 is formed on the second mold layer 172. The third mask layer 175 may be formed using material that has an etching selectivity relative to the first mold layer 166, the third insulation layer 169 and the second mold layer 172. For example, the third mask layer 175 may include polysilicon or nitride such as silicon nitride. The third mask layer 175 has a thickness of about 100 to about 6,000 Å, measured from an upper face of the second mold layer 172. The thickness of the first mold layer 166, the second mold layer 172, and the third mask layer 175 may vary in accordance with the capacitance of the capacitors 205.

In an embodiment of the present invention, after the second mold layer 172 is planarized by a CMP process, an etch back process or a combination process of CMP and etch back, the third mask layer 175 may be formed on the planarized second mold layer 172.

Figure 5A:
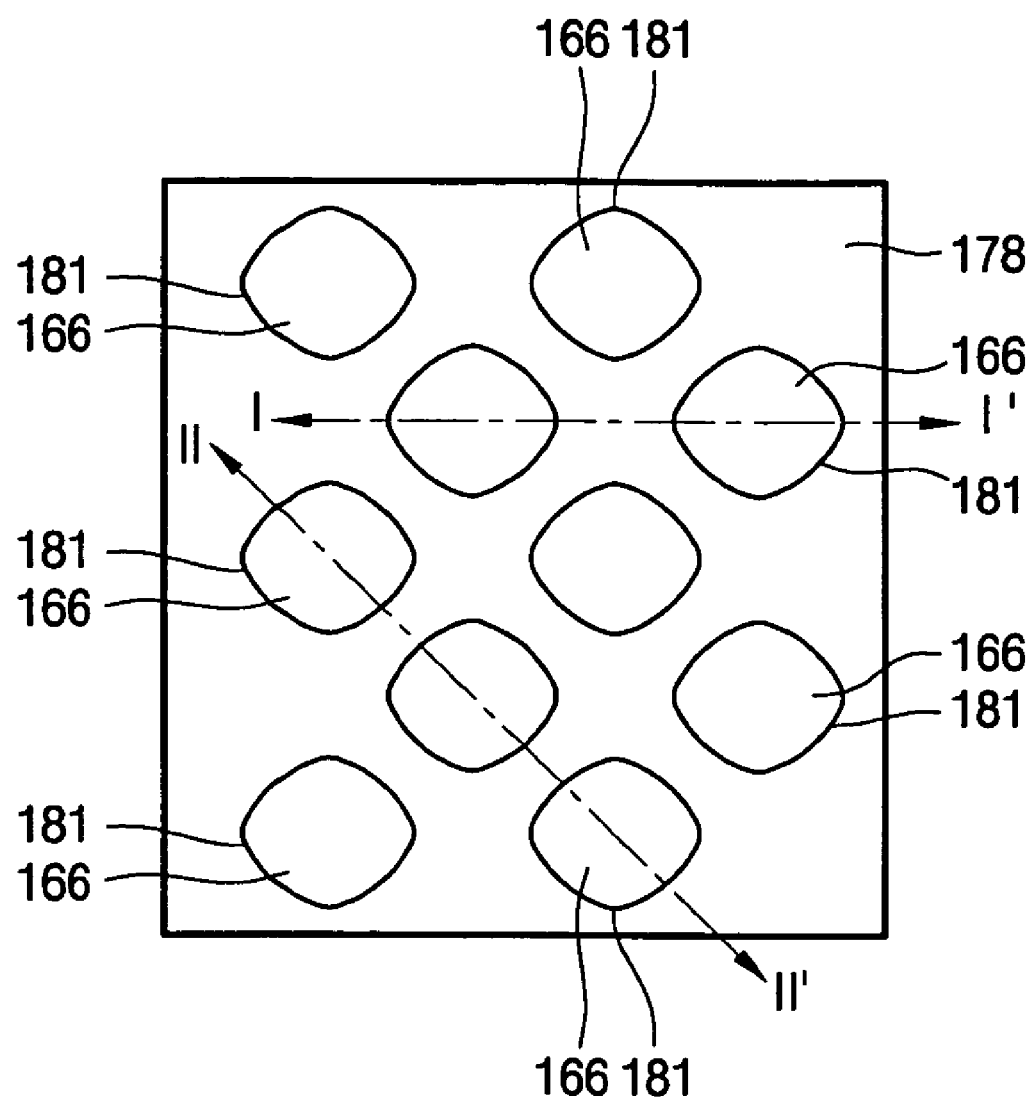
FIGS. 5A, 6A and 7A are plan views illustrating the semiconductor device.
Figure 5B:
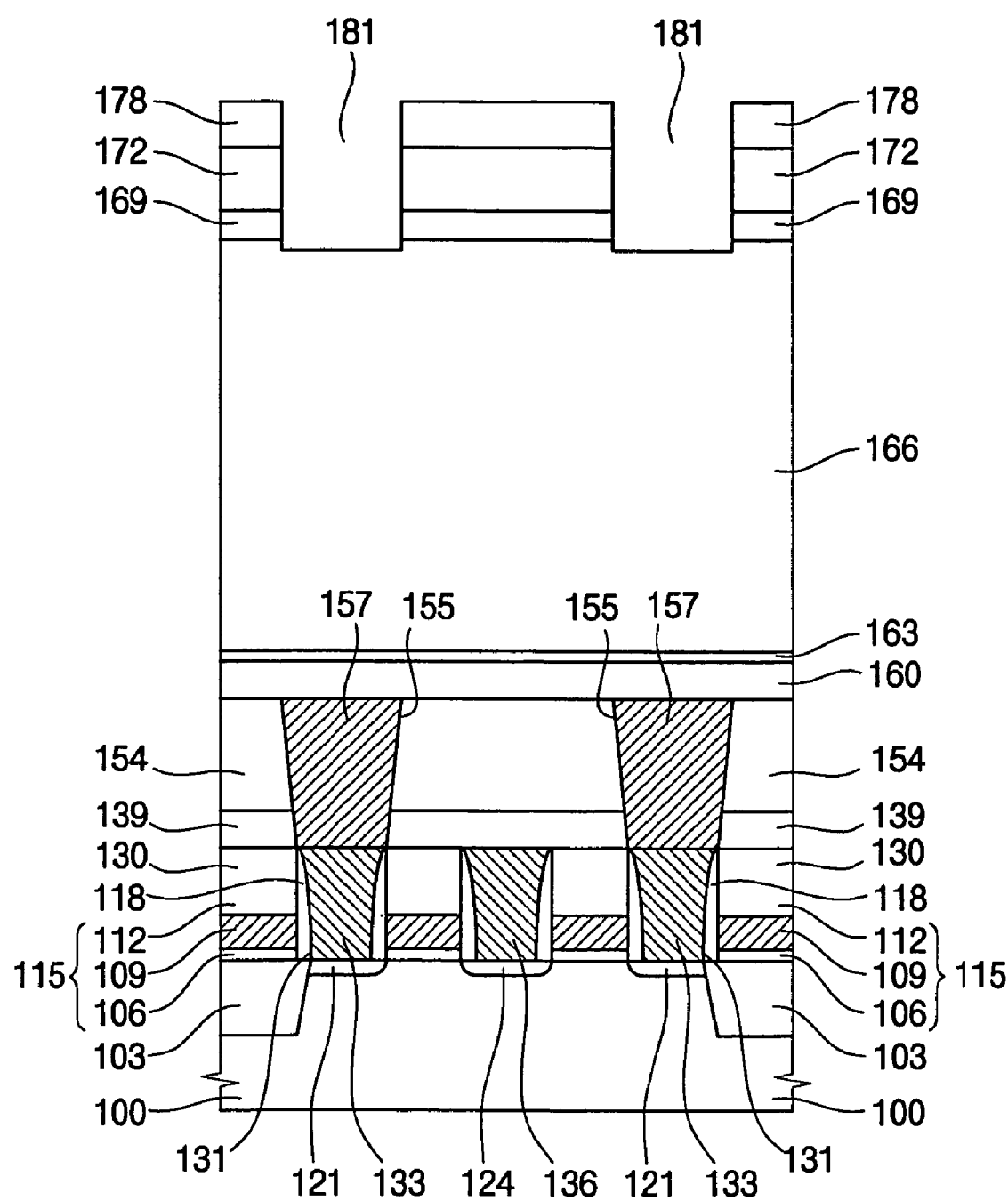
Figure 5C:
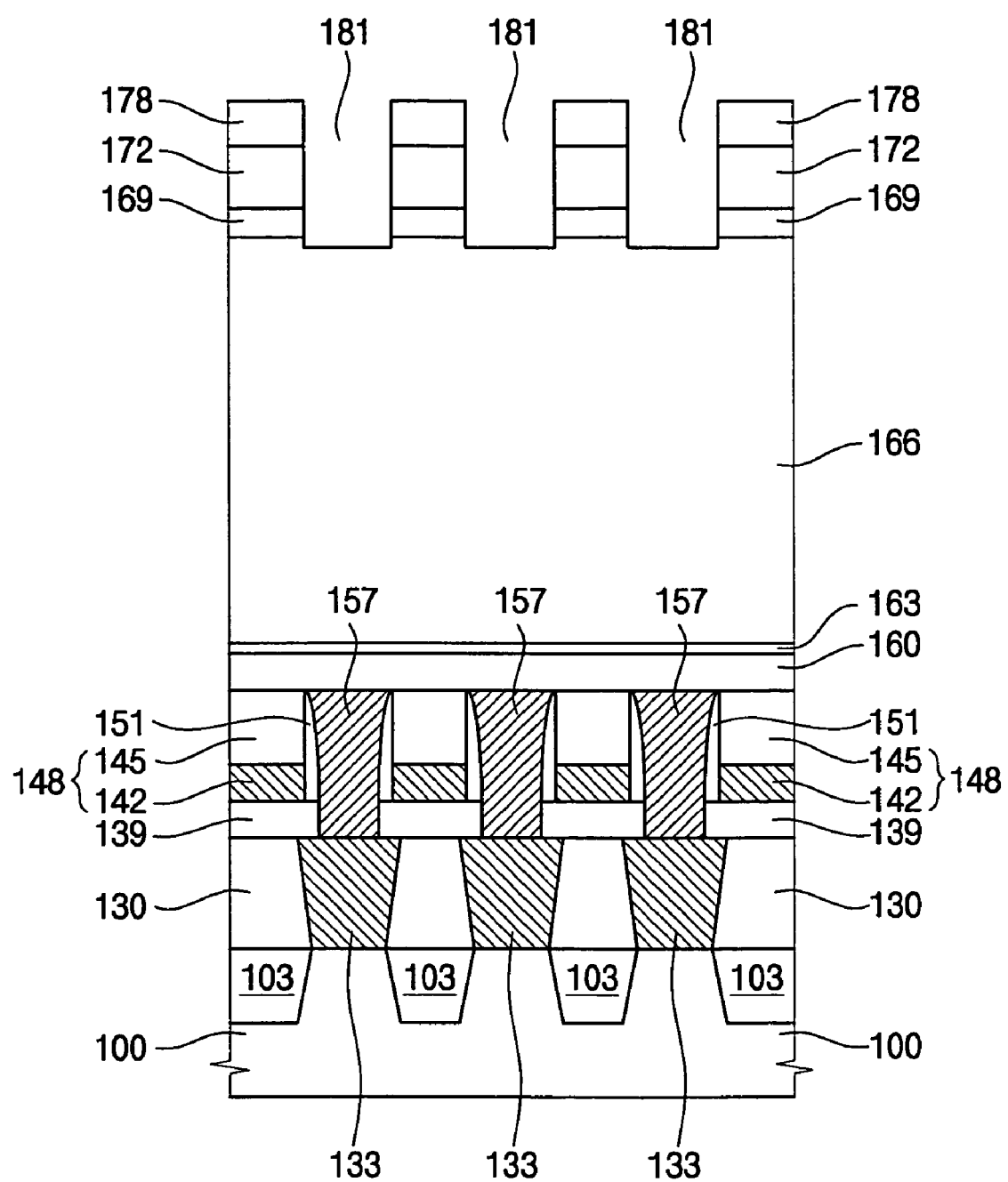

FIG. 5A is a plan view illustrating the formation of a first opening 181, FIG. 5B is a cross sectional view illustrating the formation of the first opening 181 taken along line I–I' in FIG. 5A, and FIG. 5C is a cross sectional view illustrating the formation of the first opening 181 taken along line II–II' in FIG. 5A.

Referring to FIGS. 5A to 5C, after a sixth photoresist pattern (not shown) is formed on the third mask layer 175, the third mask layer 175 is patterned using the sixth photoresist pattern as an etching mask, thereby forming the storage mask pattern 178 on the second mold layer 172. Then, the sixth photoresist pattern is removed by an ashing process, a stripping process, or both.

In an embodiment, the sixth photoresist pattern may instead be removed during an etching process of forming the first openings 181 without performing the ashing process, the stripping process, or neither.

Further, to ensure process margin of a subsequent photolithography process, a third ARL may be formed on the third mask layer 175, and then the photolithography process may be performed to form the storage mask pattern 178.

A first etching process is performed on portions of the second mold layer 172, portions of the third insulation layer 169 and upper portions of the first mold layer 166 using the storage mask pattern 178 as an etching mask to thereby form the first openings 181 from the second mold layer 172 to the upper portion of the first mold layer 166. That is, each of the first openings 181 is formed to the upper portion of the first mold layer 166 through the second mold layer 172 and the third insulation layer 169. The first etching process is anisotropic. The first openings 181 are positioned over the fourth pads 157 and the first pads 133, respectively.

As shown in FIG. 5A, the first openings 181 in a unit cell are separated from one another in a first direction (a direction along line I–I') and a second direction (a direction along line II–II') by predetermined equal intervals. That is, the first openings 181 do not make contact with one another. Particularly, the first openings 181 are separated in the first direction parallel to a direction where underlying structures are arranged, and also the first openings 181 are apart in the second direction corresponding to a right diagonal direction, a left diagonal direction, or both, relative to the direction where underlying structures are arranged. The underlying structures may include the word lines 127 and the bit lines 148. Here, the first openings 181 are separated by first intervals along the first direction, whereas the first openings 181 are separated by second intervals along the second direction. The first intervals are substantially wider than the second intervals.

Figure 6A:
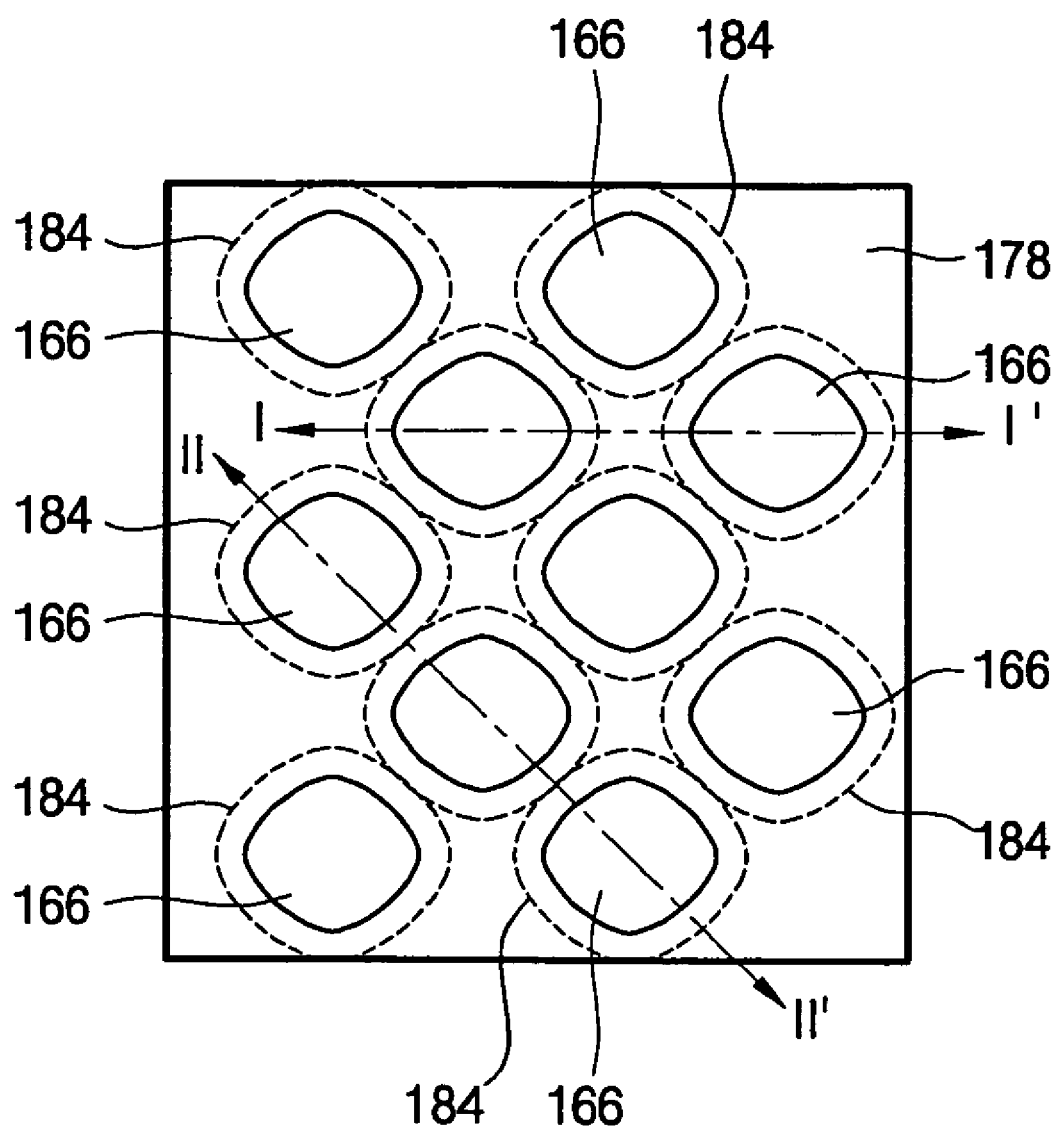
Figure 6B:
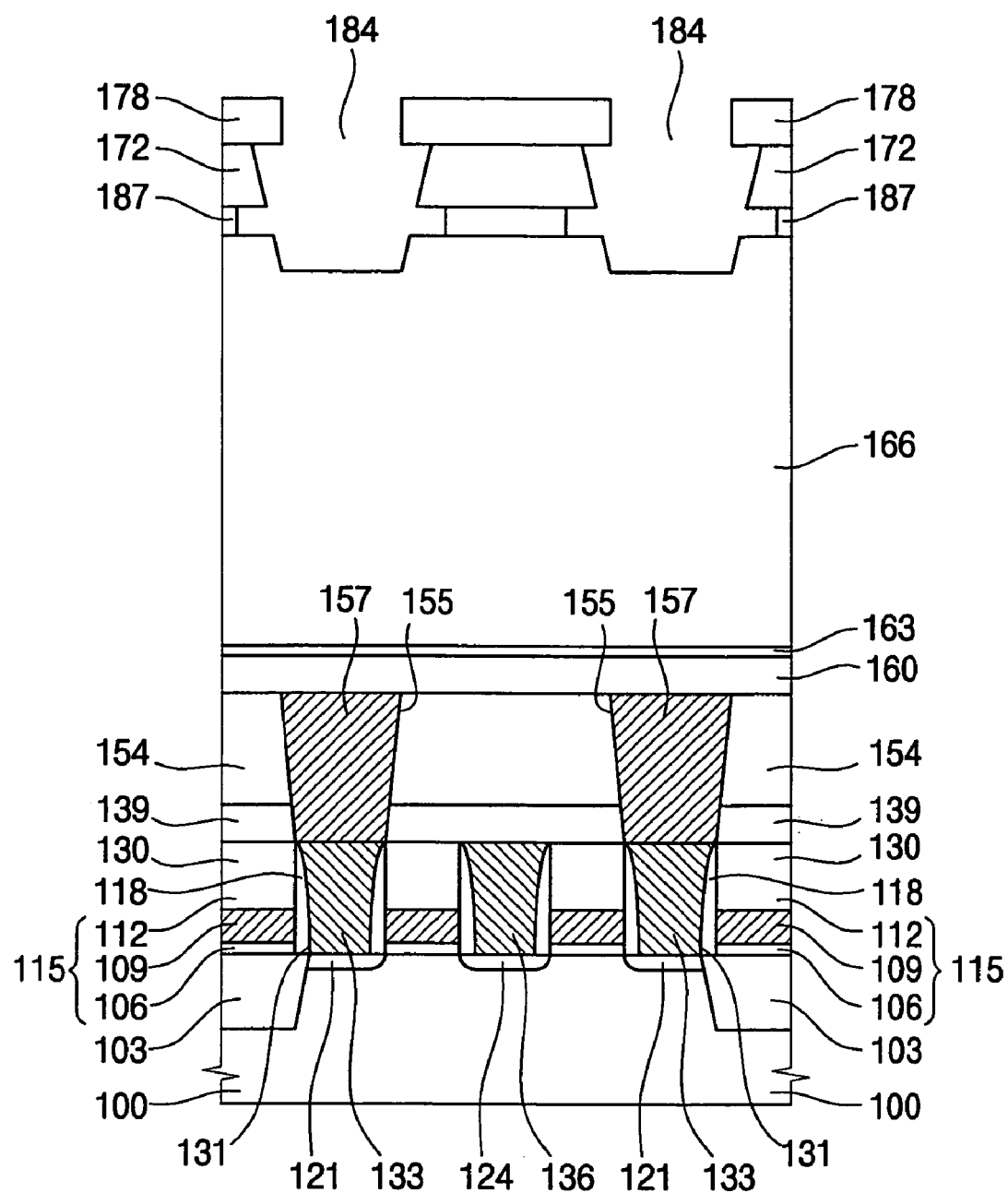

FIG. 6A is a plan view illustrating the formation of second openings 184; FIG. 6B is a cross sectional view illustrating the formation of the second opening 184 taken along line I–I' in FIG. 6A; and FIG. 6C is a cross sectional view illustrating the formation of the second opening 184 taken along line II–II' in FIG. 6A.

Figure 6C:
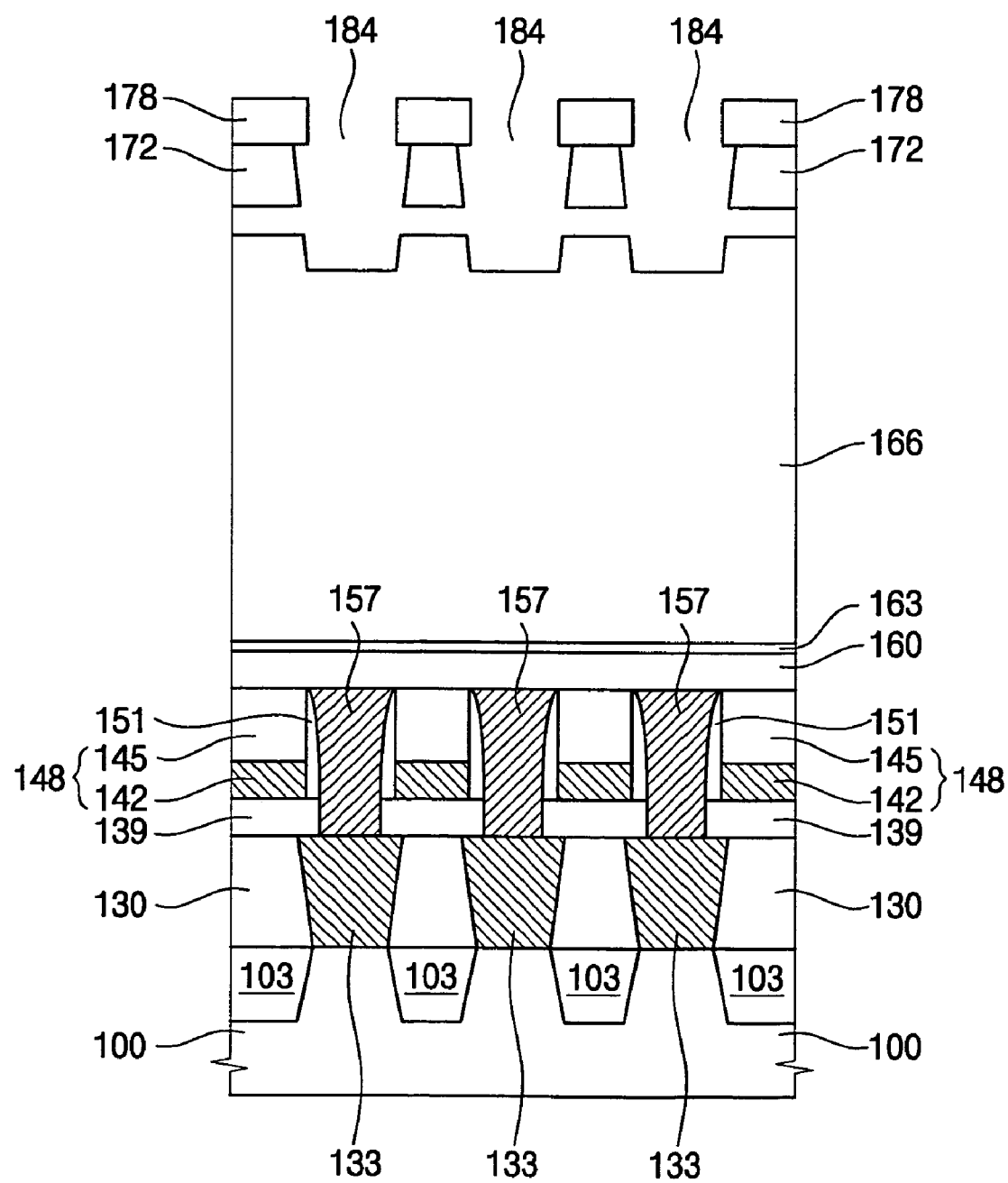

Referring to FIGS. 6A to 6C, using the storage mask pattern 178 as an etching mask, the second mold layer 172, the third insulation layer 169, and the first mold layer 166 are partially etched by a second etching process to form the second openings 184. The second etching process corresponds to an isotropic etching process, such as a wet etching process, a dry etching process, or a plasma etching process. After the second etching process, the first opening 181 is extended by the second etching process to form the second opening 184 having extended dimensions larger that those of the first opening 181. In particular, because sidewalls and bottoms of the first openings 181 are etched in the second etching process, each of the second openings 184 has a width wider than that of the first opening 181, and a depth deeper than that of the first opening 181. Here, the second openings 184 have slightly sloped sidewalls due to the isotropic etching process.

In this embodiment, the second openings 184 are separated from one another by predetermined equal intervals along the first direction, whereas the second openings 184 are partially connected to one another along the second direction because the second openings 184 have the extended widths and depths. As shown in FIG. 6C, in the second etching process the third insulation layer 169 is rapidly etched comparing to the second and first mold layers 172 and 166. Because the first intervals along the first direction are substantially wider than the second intervals along the second direction, the third insulation layer 169 partially remains along the first direction to form third insulation layer patterns 187 between the first and second mold layers 166 and 172; whereas the third insulation layer 169 is completely removed along the second direction. Therefore, the second openings 184 are partially connected to one another along the second direction but the second openings 184 do not connect to one another in the first direction due to the third insulation layer patterns 187. The second openings 184 are connected to one another in the second direction so that all of the second openings 184 in the unit cell are partially connected to one another. That is, all of the second openings 184 are connected to one another along the right diagonal direction, left diagonal direction, or both, relative to the direction where the underlying structures are arranged.

Figure 7A:
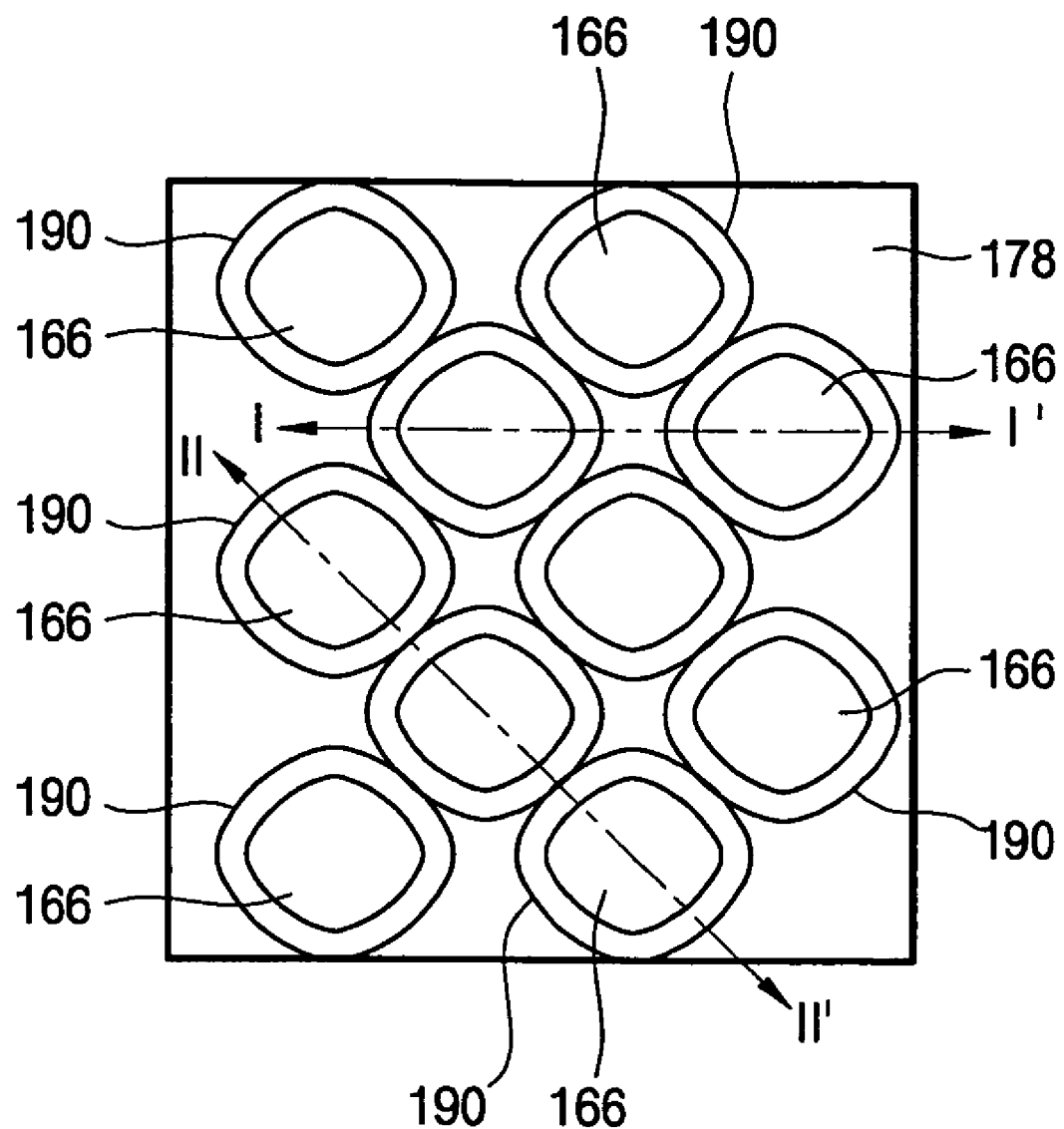
Figure 7B:
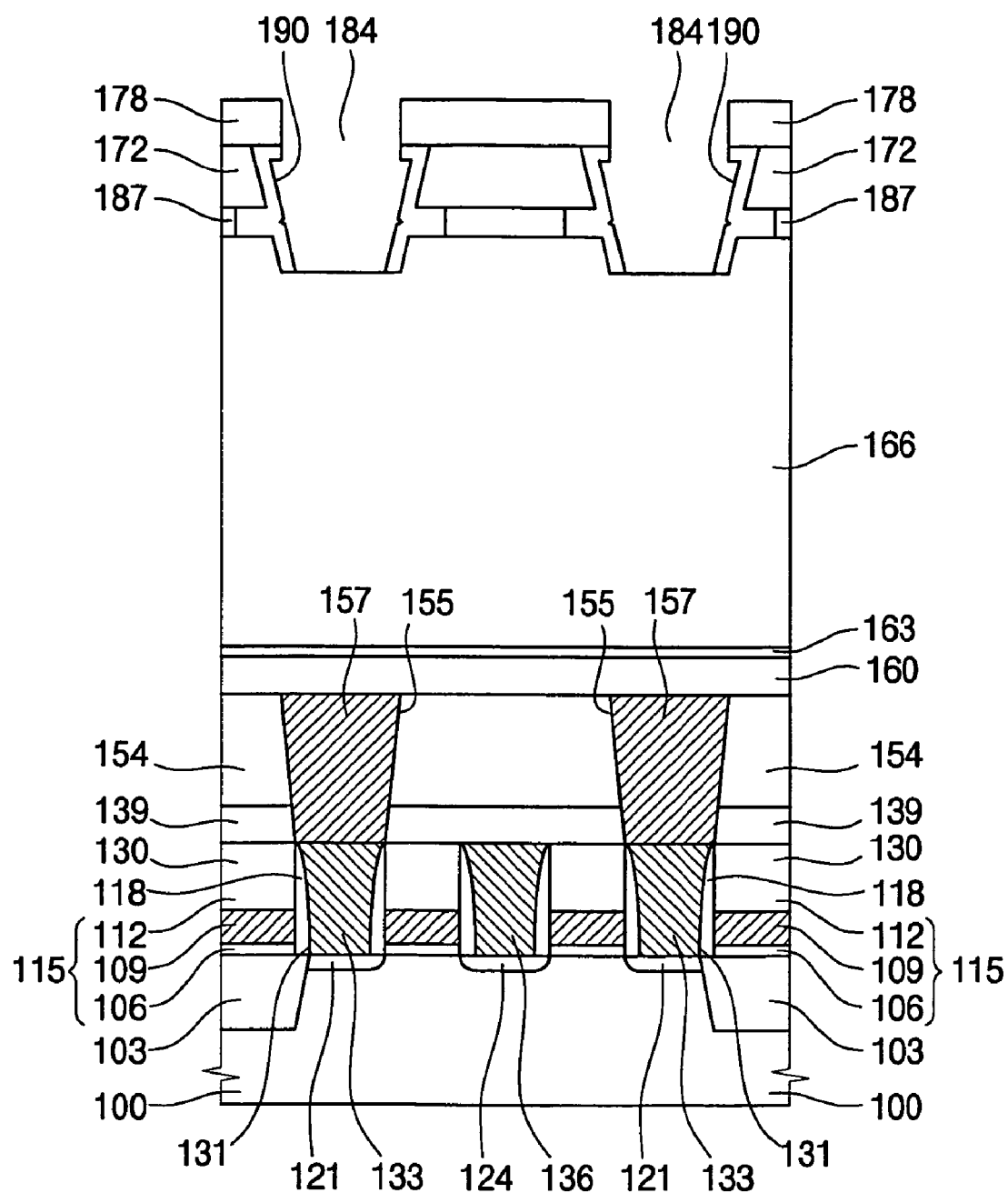
Figure 7C:
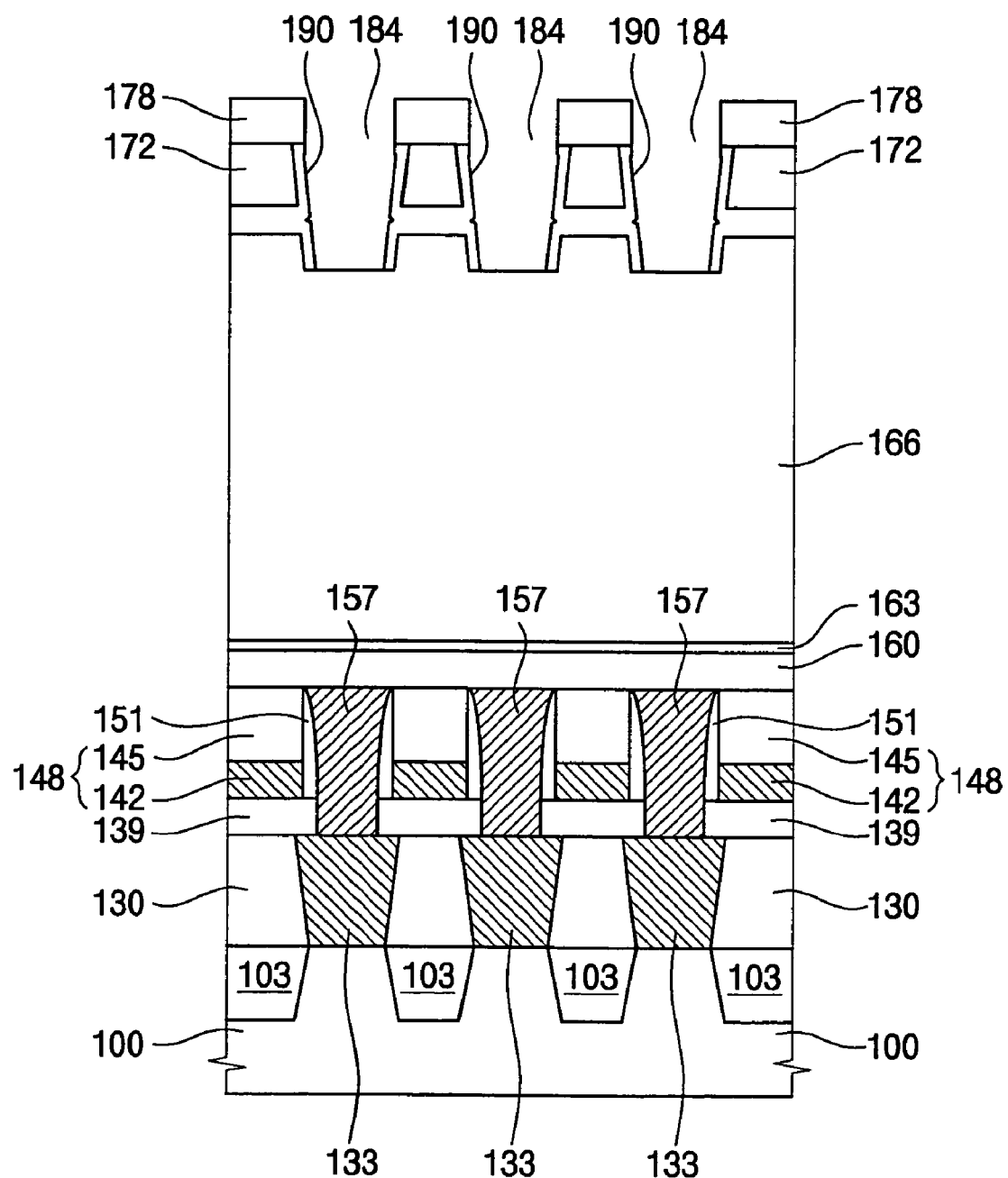

FIG. 7A is a plan view illustrating the formation of the stabilizing members 190, FIG. 7B is a cross sectional view illustrating the formation of the stabilizing members 190 taken along line I–I' in FIG. 7A, and FIG. 7C is a cross sectional view illustrating the formation of the stabilizing members 190 taken along line II–II' in FIG. 7A.

Referring to FIGS. 7A to 7C, a fourth insulation layer (not shown) is formed on bottoms and sidewalls of the second openings 184 and the storage mask pattern 178. The fourth insulation layer may be formed using insulating material that has an etching selectivity relative to oxide. For example, the fourth insulation layer is formed using nitride or polysilicon. The fourth insulation layer has a thickness of about 100 to about 5,000 Å, measured from an upper face of the storage mask pattern 178.

Portions of the fourth insulation layer are anisotropically etched to form the stabilizing members 190 on inner sidewalls of the second openings 184. That is, the portions of the fourth insulation layer positioned on the bottoms of the second openings 184 and the storage mask pattern 178 are etched by an anisotropic etching process, thereby forming the stabilizing members 190 on insides of the second openings 184. As described above, because the third insulation layer patterns 187 are formed between adjacent second openings 184 along the first direction, the stabilizing members 190 do not connect one another along the first direction. However, the second openings 184 are partially connected to one another along the second direction so that the stabilizing members 190 are also connected to one another in the second direction. Namely, all of the stabilizing members 190 in the unit cell are connected to one another along the second direction relative to the contact region, namely, the direction of the arranged word lines 127 or the bit lines 148. When the stabilizing members 190 have the above-described construction, all of the capacitors 205 including the stabilizing members 190 may support one another along the second direction without collapse thereof. Here, each of the stabilizing members 190 may generally have an H-shaped cross section along the second direction.

Figure 8A:
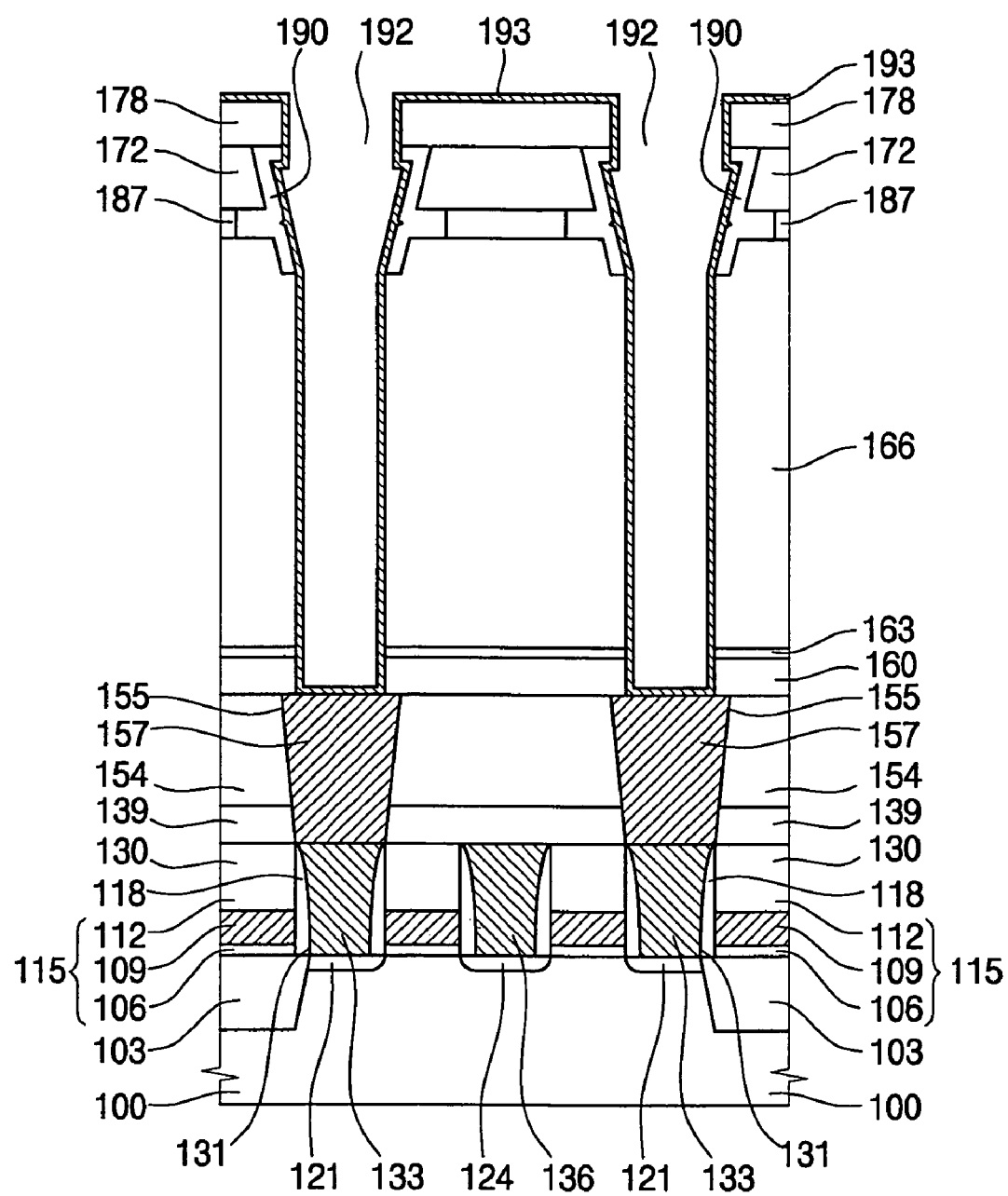
Figure 8B:
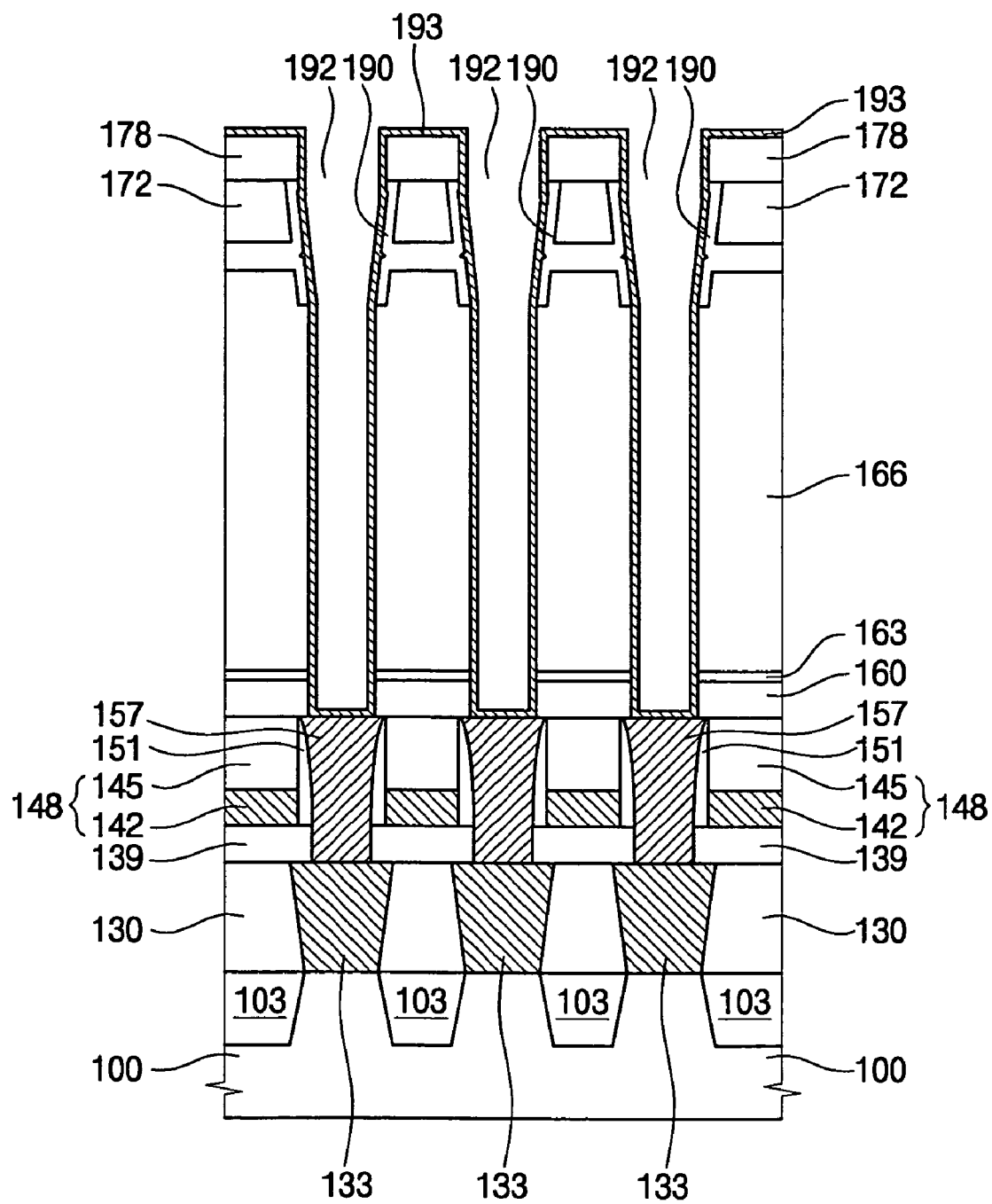

FIGS. 8A and 8B are cross sections illustrating the formation of the storage contact holes 192 and a fifth conductive layer 193.

Referring to FIGS. 8A and 8B, continuously using the storage mask pattern 178 as an etching mask, the first mold layer 166, the etch stop layer 163 and the fourth insulation interlayer 160 are partially etched to thereby form the storage contact holes 192 exposing the fourth pads 157, respectively. Because the stabilizing members 190 are positioned on the inner sidewalls of the second openings 184, the storage contact holes 192 are self-aligned with respect to the stabilizing members 190.

The fifth conductive layer 193 is formed on the exposed fourth pads 157, inner sidewalls of the storage contact holes 192, insides of the stabilizing members 190 and the storage mask pattern 178. The fifth conductive layer 193 may be formed using conductive material, such as doped polysilicon or metal. The stabilizing members 190 may be attached to the fifth conductive layer 193. Additionally, portions of the fifth conductive layer 193 press the insides of the stabilizing members 190 and support the bottom of the stabilizing members 190. Therefore, the stabilizing members 190 may be stably fixed to the fifth conductive layer 193.

The storage electrodes 196 may be formed using doped polysilicon or metal so that the capacitors 205, including the storage electrodes 196, may be advantageously employed for a silicon-insulator-silicon (SIS) structure, a metal-insulator-metal (MIM) structure, a metal-insulator-silicon (MIS) structure, etc.

FIGS. 9A and 9B are cross sectional views of an embodiment of the present invention illustrating the formation of the storage electrodes 196.

Referring to FIGS. 9A and 9B, using a CMP process, an etch back process, or a combination process of CMP and etch back, the fifth conductive layer 193 and the storage mask pattern 178 are etched until the second mold layer 172 is exposed. Thus, the storage electrodes 196 are formed on the fourth pads 157, the inner sidewalls of the storage contact holes 192 and the insides of the stabilizing members 190. Here, the second mold layer 172 and the stabilizing members 190 are partially removed during the formation of the storage electrodes 196.

Figure 10A:
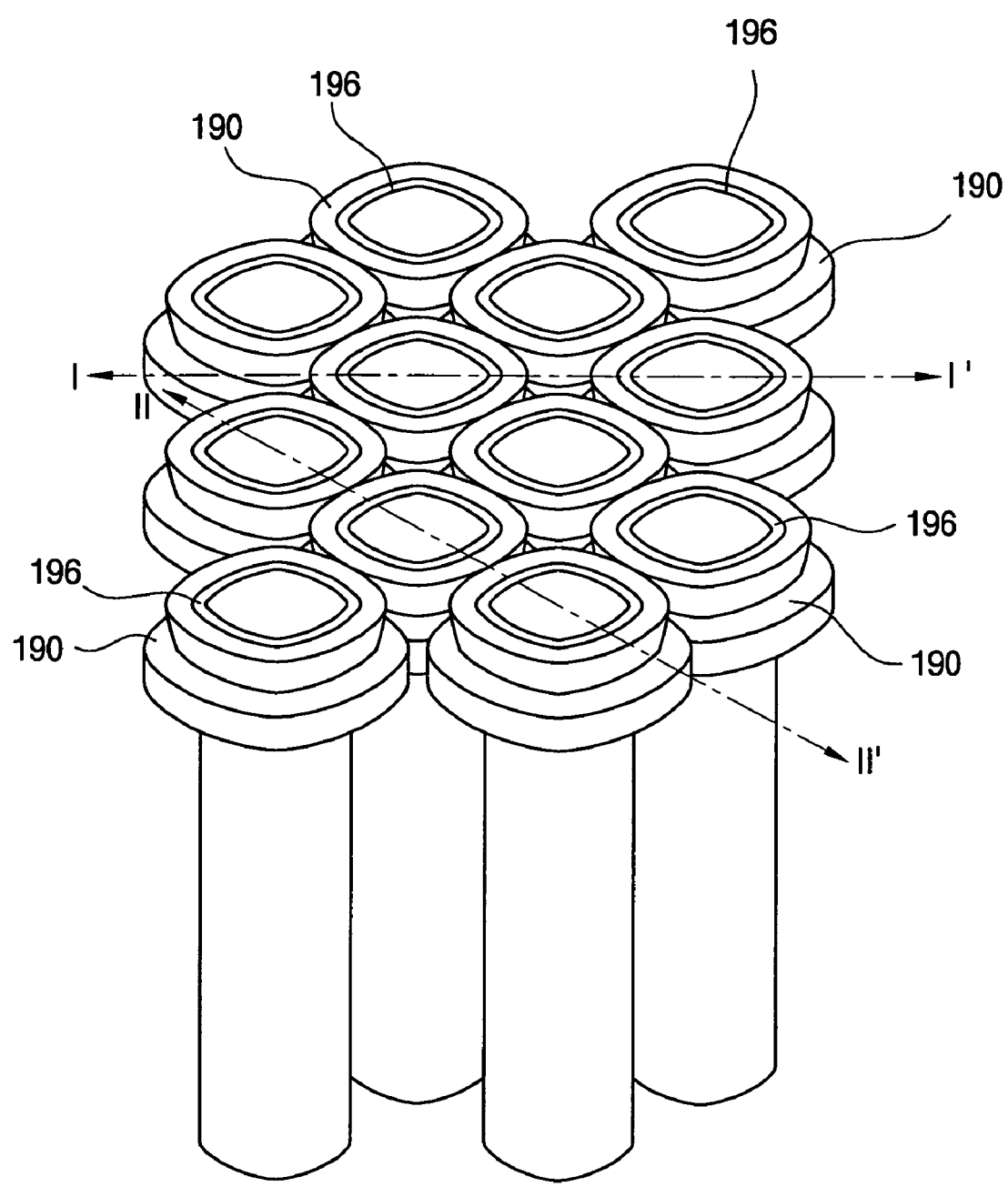
FIG. 10A is a perspective view illustrating the capacitor in accordance with one embodiment of the present invention.
Figure 10B:
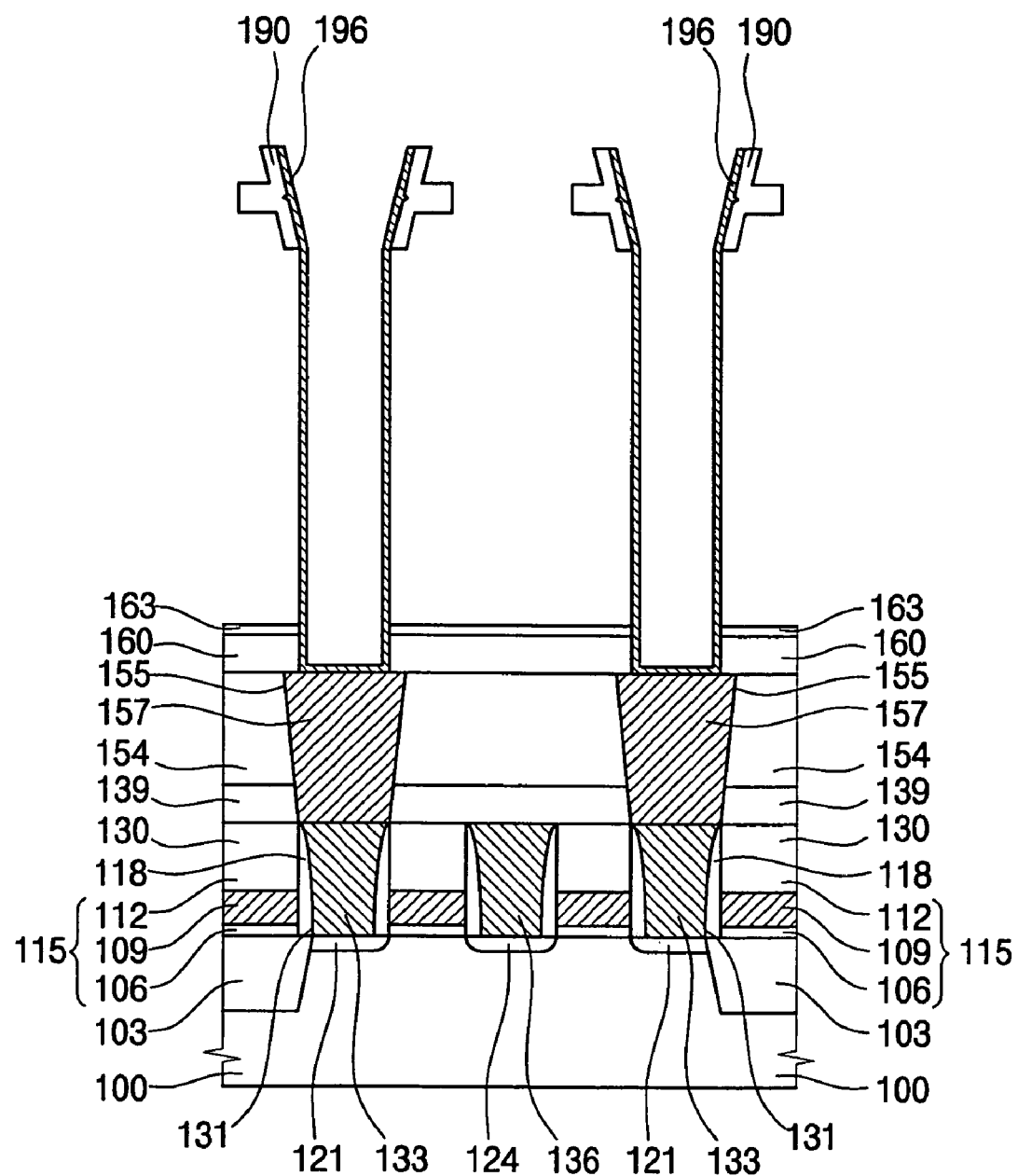
Figure 10C:
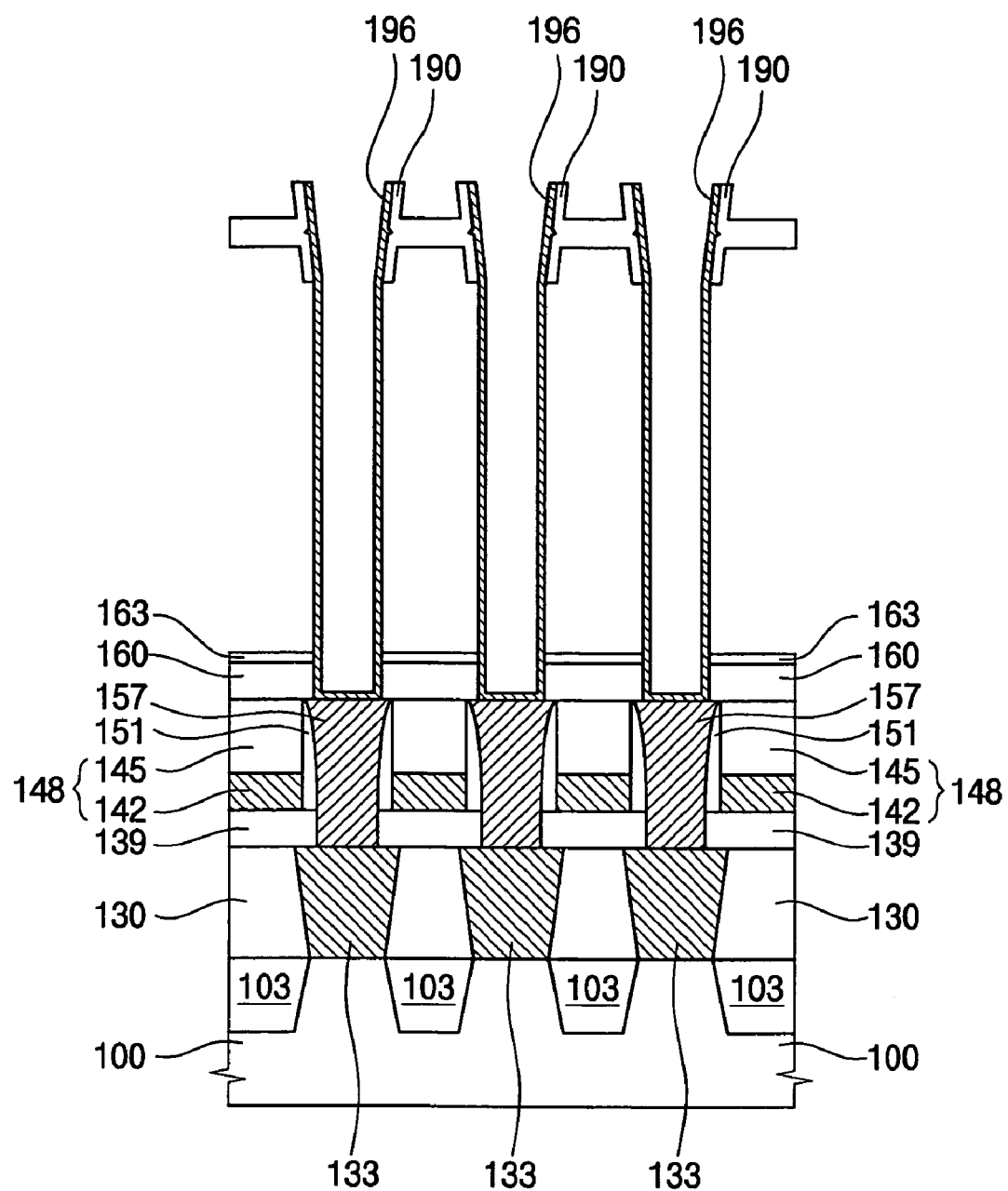

FIG. 10A is a perspective view of an embodiment of the present invention illustrating processing steps of completing the storage electrode 196 and the stabilizing member 190, FIG. 10B is a cross sectional view illustrating the processing steps of completing the storage electrode 196 and the stabilizing member 190 taken along line I–I' in FIG. 10A, and FIG. 10C is a cross sectional view illustrating the processing step of completing the storage electrode 196 and the stabilizing member 190 taken along line II–II' in FIG. 10A.

Referring to FIGS. 10A to 10C, the second mold layer 172, the third insulation layer patterns 187 and the first mold layer 166 are removed to thereby complete the stabilizing members 190 and the storage electrodes 196 making contact with the fourth pads 157. In one embodiment, the second mold layer 172, the third insulation layer patterns 187 and the first mold layer 166 may be etched by a wet etching process using an etching solution that includes ammonium fluoride, hydrogen fluoride, and pure water such as LAL. Alternatively, the second mold layer 172, the third insulation layer patterns 187, and the first mold layer 166 may be etched by a dry etching process using a first etching gas that includes hydrogen fluoride and water vapor, and sequentially using a second etching gas that includes carbon tetrafluoride and oxygen.

As the second mold layer 172, the third insulation layer patterns 187, and the first mold layer 166 are etched, central portions of the stabilizing members 190 are horizontally protruded relative to the substrate 100 along the second direction. Thus, all of the stabilizing members 190 in the unit cell are connected to one another through their central protruding portions in parallel relative to the substrate 100. That is, adjacent stabilizing members 190 support each other through their central protruding portions. Since the stabilizing members 190 respectively enclose upper portions of the storage electrodes 196, all of the storage electrodes 196 in the unit cell support one another so that the storage electrodes 196 have greatly improved structural stabilities. Therefore, although the storage electrodes 196 may have considerably high aspect ratios, the storage electrodes 196 are not likely to collapse, so that a two-bit fail of a semiconductor device may be effectively prevented.

In one embodiment of the present invention, after the storage contact holes 192 are filled with a sacrificial layer including oxide, the sacrificial layer, the second mold layer 172, the third insulation layer patterns 187, and the first mold layer 166 may be etched by the wet etching process or the dry etching process. Here, the sacrificial layer protects the storage electrodes 196 during the etching process to complete the storage electrodes 196 and the stabilizing members 190.

Figure 11A:
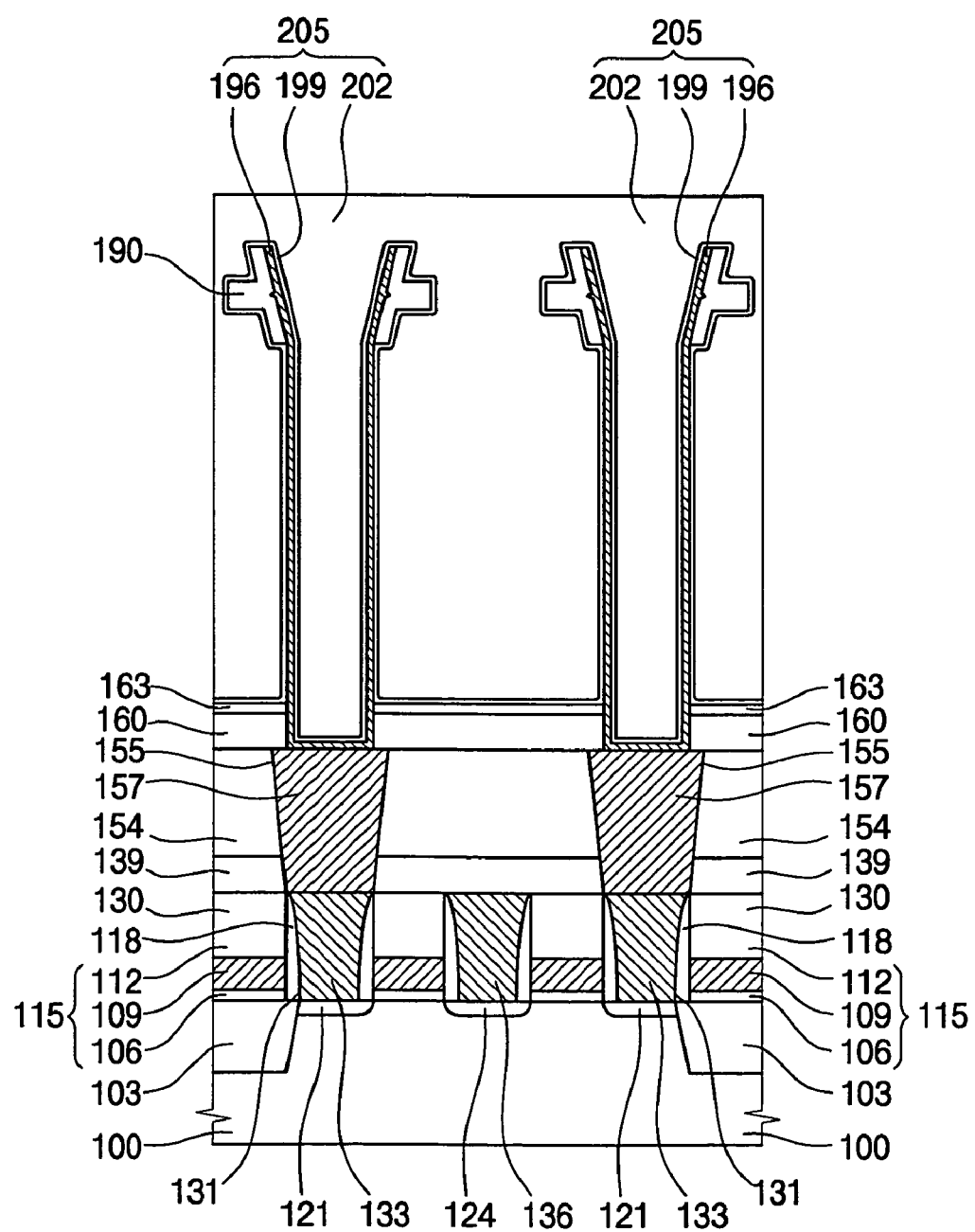
Figure 11B:
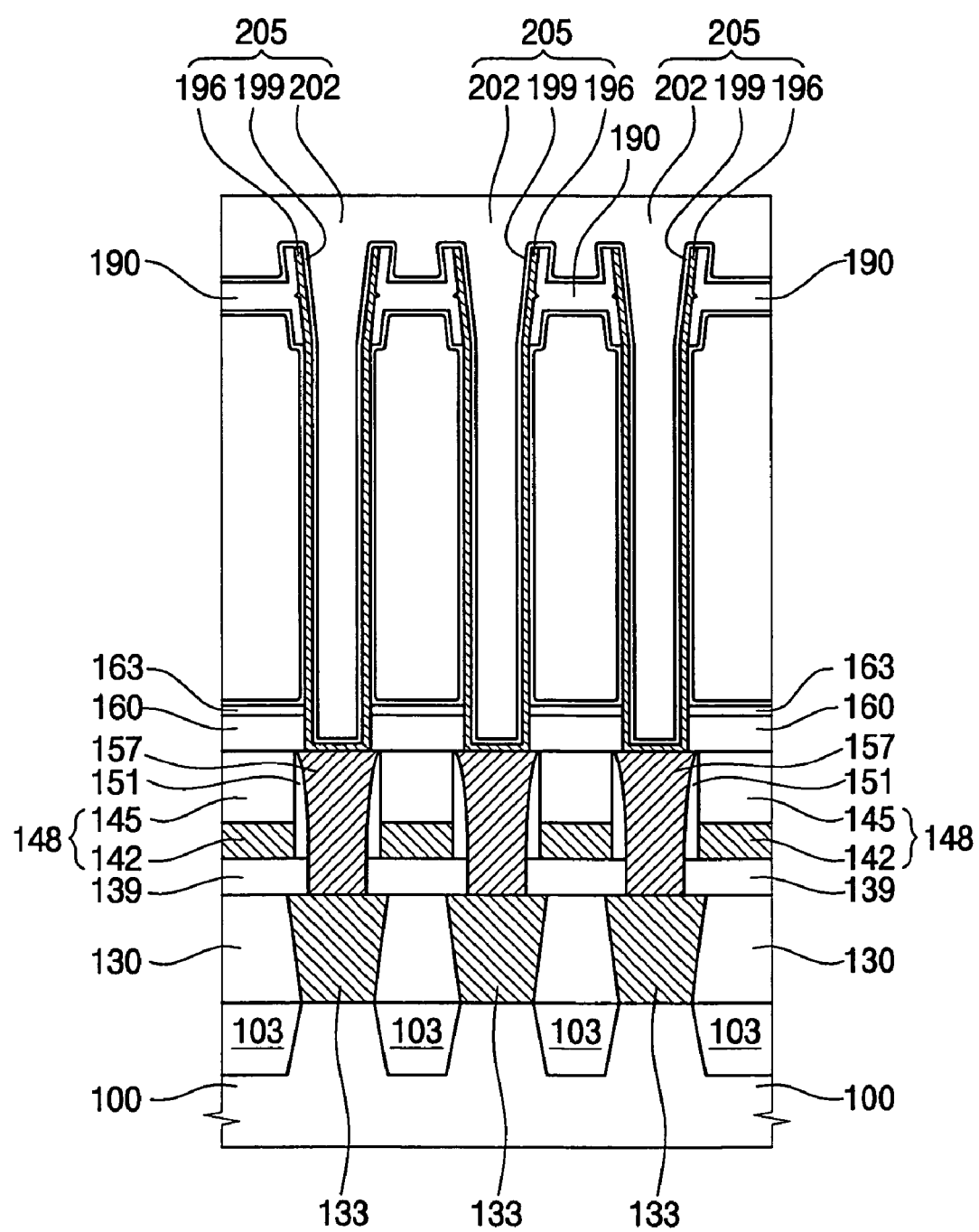

FIGS. 11A and 11B are cross sectional views of an embodiment of the present invention illustrating the formation of the capacitors 205.

Referring to FIGS. 11A and 11B, dielectric layers 199 and plate electrodes 202 are successively formed on the storage electrodes 196 when the stabilizing members 190 are connected to one another, thereby forming the capacitors 205 over the semiconductor substrate 100.

The capacitors 205 in the unit cell are separated from one another along the first direction, whereas the capacitors 205 are connected to one another in the second direction because the stabilizing members 190 are connected by the central protruding portions thereof. Therefore, all of the capacitors 205 in the unit cell may support one another without collapse when the capacitors 205 may have extremely high aspect ratios.

A fifth insulating interlayer (not shown) is formed on the capacitors 205 to electrically isolate the capacitors 205 from upper wiring (not shown) successively formed thereon. When the upper wiring is formed on the fifth insulating interlayer, the semiconductor device including the capacitors 205 is completed.

FIGS. 12A to 17B are cross sectional views of an embodiment of the present invention illustrating a method of manufacturing a capacitor in accordance with one embodiment of the present invention. In this embodiment, an etch stop layer 223 is formed on a fourth insulating interlayer 220 by a process substantially identical to that of the above-described method with reference to FIGS. 3A to 4B. FIGS. 12A, 13A, 14A, 15A, 16A and 17A are cross sectional views illustrating a semiconductor device including the capacitor taken along the first direction, and FIGS. 12B, 13B, 14B, 15B, 16B and 17B are cross sectional views illustrating the semiconductor device including the capacitor taken along the second direction.

Figure 12A:
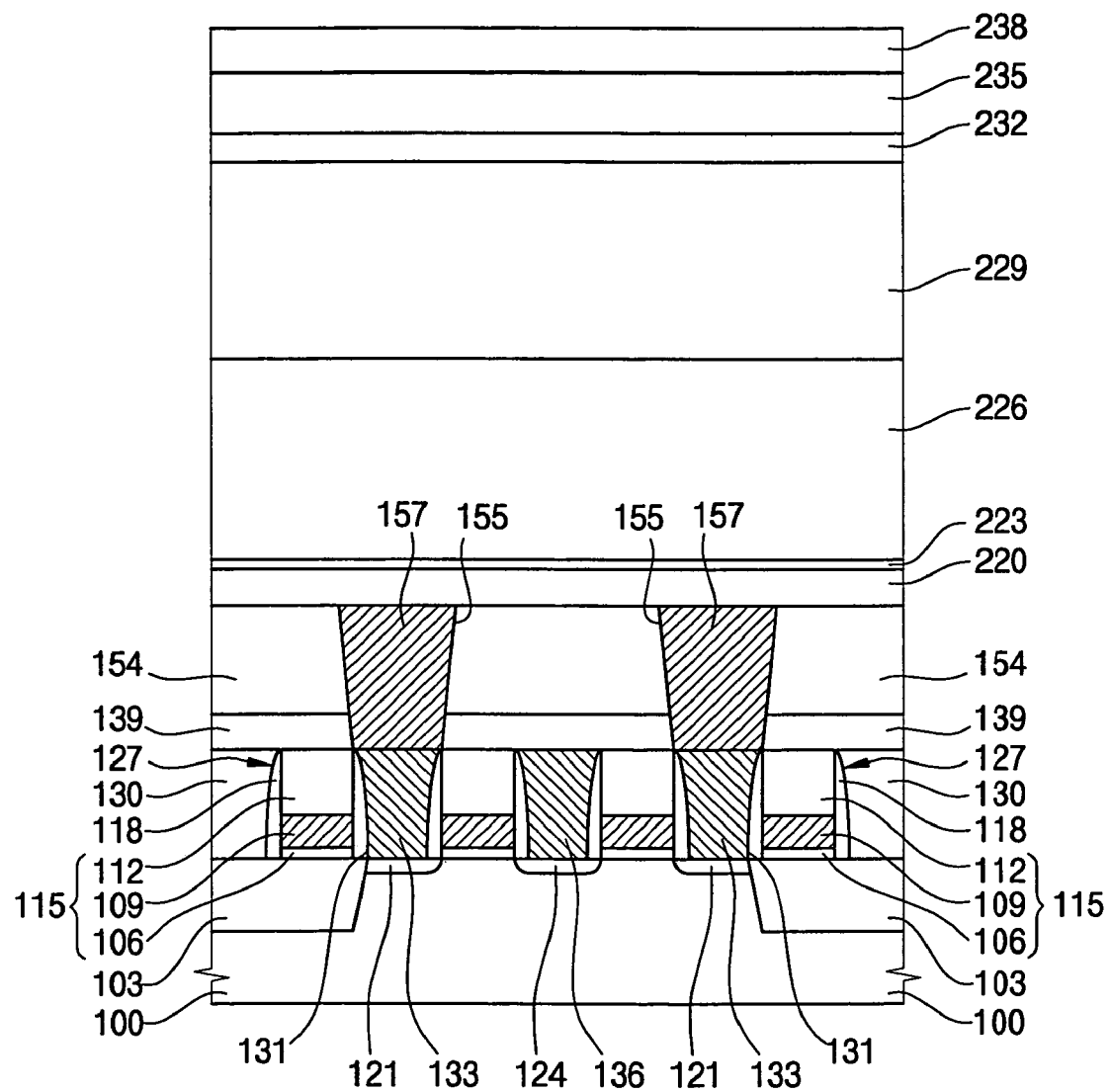
FIGS. 12A, 13A, 14A, 15A, 16A and 17A are cross sectional views illustrating a semiconductor device including a capacitor taken along the first direction in accordance with another embodiment of the present invention.
Figure 12B:
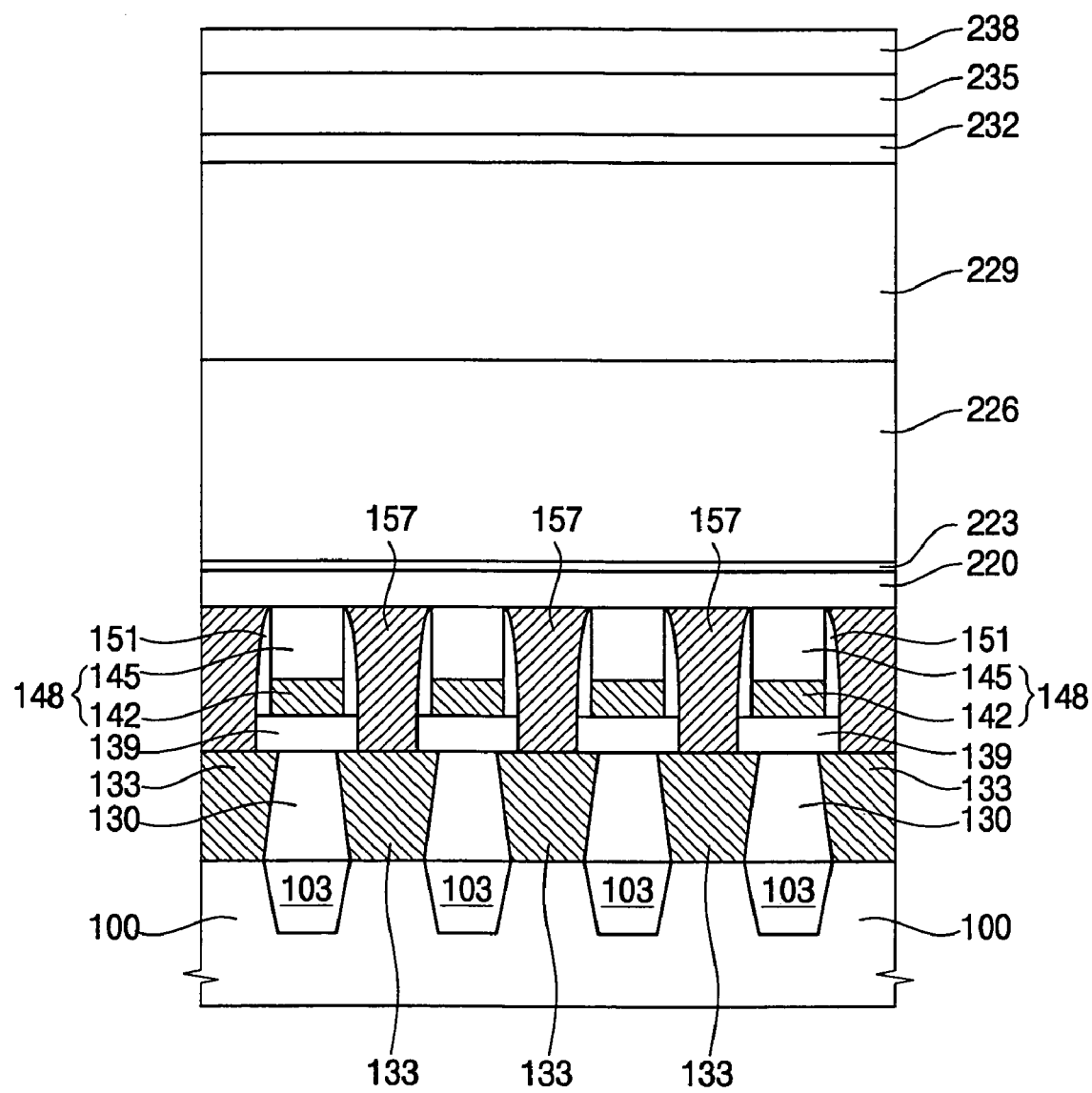
FIGS. 12B, 13B, 14B, 15B, 16B and 17B are cross sectional views illustrating the semiconductor device including the capacitor taken along the second direction in accordance with still another embodiment of the present invention.

FIGS. 12A and 12B are cross sectional views illustrating the formation of a first mold layer 226, a second mold layer 229, a third insulation layer 232, a third mold layer 235 and a third mask layer 238.

Referring to FIGS. 12A and 12B, the fourth insulating interlayer 220 and the etch stop layer 223 are successively formed on fourth pads 157 and a third insulating interlayer 154. For example, the fourth insulating interlayer 220 includes oxide and the etch stop layer 223 includes nitride.

The first and second mold layers 226 and 229 are sequentially formed on the etch stop layer 223. An entire thickness of the first and second mold layers 226 and 229 may be in a range of about 5,000 to about 50,000 Å, measured from an upper face of the etch stop layer 223. For example, the first mold layer 226 has a thickness substantially identical to that of the second mold layer 229.

In one embodiment of the present invention, the first mold layer 226 may be formed using oxide doped with impurities of a first concentration, whereas the second mold layer 229 may be formed using undoped oxide or oxide doped with impurities with a second concentration. For example, the first mold layer 226 includes BPSG or PSG having impurities such as phosphorus (P) or boron (B) with the first concentration, and the second mold layer 229 includes USG or TEOS having no impurities therein. Alternatively, the second mold layer 229 may include BOSG or PSG having impurities with the second concentration. Here, the second concentration is substantially higher than the first concentration. As a result, by a wet etching process that uses an etching solution including hydrogen fluoride or an etching solution including ammonium hydroxide, hydrogen peroxide, and deionized water, the first mold layer 226 may be rapidly etched compared to the second mold layer 229. Alternatively, the first mold layer 226 may be rapidly etched compared with the second mold layer 229 by a dry etching process that sequentially uses a first etching gas, including hydrogen fluoride and water vapor, and a second etching gas including carbon tetrafluoride and oxygen.

The third insulation layer 232 is formed on the second mold layer 229. For example, the third insulation layer 232 includes BPSG or PSG having impurities of a third concentration. The third concentration of the third insulation layer 232 is substantially lower than the first concentration of the first mold layer 226. Thus, the third insulation layer 232 may be most rapidly etched compared to the first and second mold layers 226 and 229, by the above-described wet etching process or the dry etching process. Because the third insulation layer 232, the second mold layer 229, and the first mold layer 226, respectively, have different etching rates in accordance with their impurity concentrations, storage contact holes 252 (see FIGS. 15A and 15B) have angled cross sections, having a sort of pyramid shape.

Referring now to FIGS. 12A and 12B, the third mold layer 235 is formed on the third insulation layer 232. The third mold layer 235 may be formed using undoped oxide or oxide doped with impurities of a fourth concentration. For example, the third mold layer 235 includes USG, PE-TEOS or HDP-CVD oxide. Alternatively, the third mold layer 235 may include BPSG or PSG having impurities of the fourth concentration. The fourth concentration of the third mold layer 235 is substantially equal to or higher than the second concentration of the second mold layer 229. Therefore, the third mold layer 235 and the second mold layer 229 may be similarly etched or the third mold layer 235 may be rapidly etched compared to the second mold layer 229.

The third mask layer 238 is formed on the third mold layer 235. The third mask layer 238 may be formed using material that has an etching selectivity to oxide. For example, the third mask layer 238 includes polysilicon or nitride.

Figure 13A:
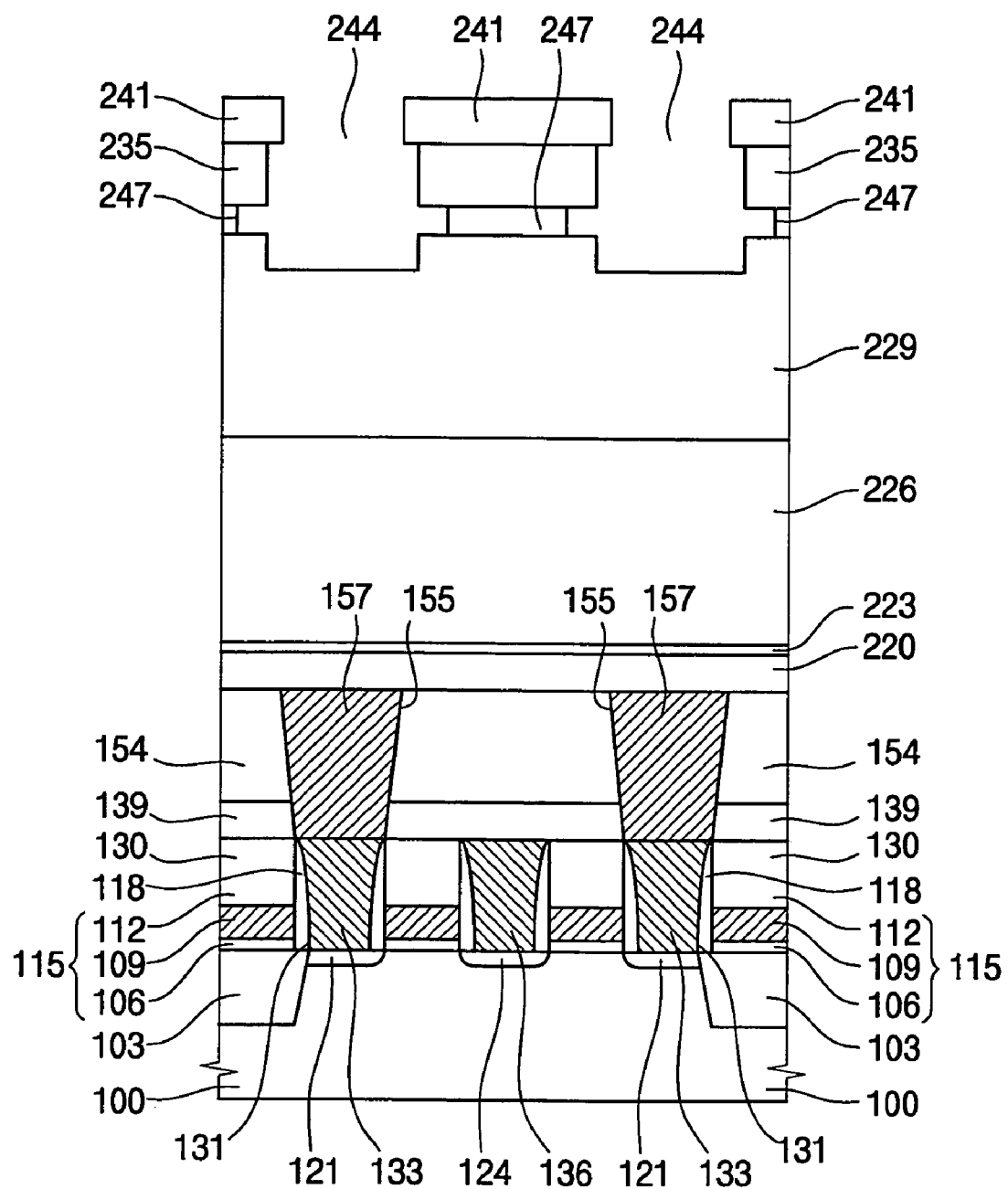
Figure 13B:
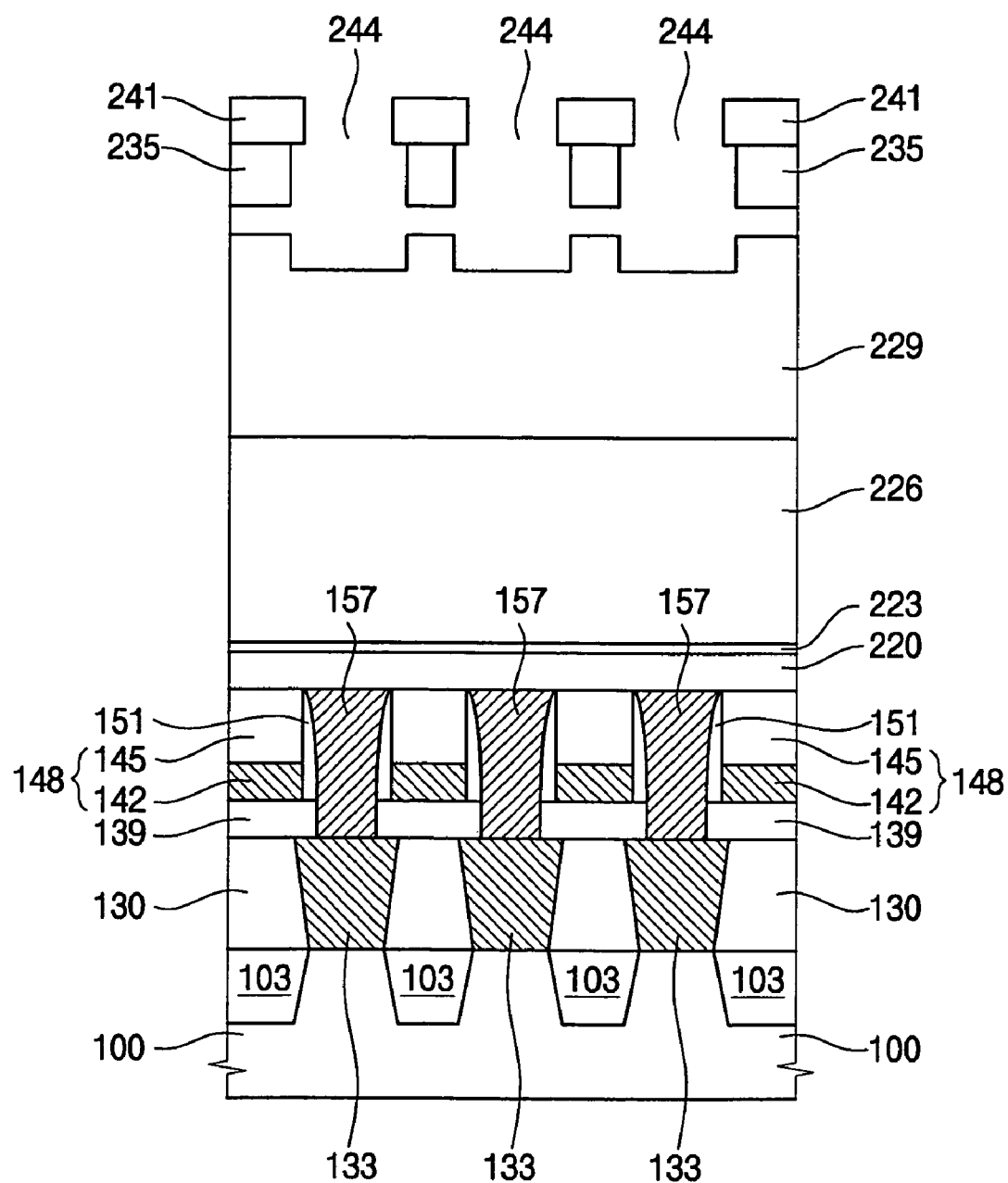

FIGS. 13A and 13B are cross sectional views of an embodiment of the present invention illustrating the formation of second openings 244.

Referring to FIGS. 13A and 13B, the third mask layer 238 is etched by a photolithography process to form a storage mask pattern 241 on the third mold layer 235.

Using the storage mask pattern 241 as an etching mask, the third mold layer 235, the third insulation layer 232, and the second mold layer 229 are partially etched to form first openings (not shown) from the third mold layer 235 to upper portions of the second mold layer 229. The first openings are formed by a first etching process corresponding to an anisotropic etching process. As described above, all of the first openings in the unit cell of the semiconductor device are separated from one another along the first and second directions.

The first openings are extended to form the second openings 244 by a second etching process corresponding to an isotropic etching process. That is, sidewalls and bottoms of the first openings are partially etched to form the second openings 244 having dimensions substantially larger than those of the first openings. The second openings 244 in the unit cell are spaced apart form one another along the first direction, whereas the second openings 244 are partially connected to one another in the first direction, as can be seen by comparing FIGS. 13A and 13B. Particularly, the third insulation layer 232 is rapidly etched compared to the third and second mold layers 235 and 229 in the second etching process. Since first intervals among the second openings 244 along the first direction are substantially wider than second intervals among the second openings 244 along the second direction, third insulation layer patterns 247 are formed between the third mold layer 235 and the second mold layer 229 along the first direction, whereas the third insulation layer 235 is completely removed along the second direction. Therefore, the second openings 244 are connected to one another in the second direction but the second openings 244 are not connected due to the third insulation layer patterns 247. Because the second openings 244 are partially connected to one another along the second direction, all of the second openings 244 in the unit cell are connected to one another along the second direction.

Figure 14A:
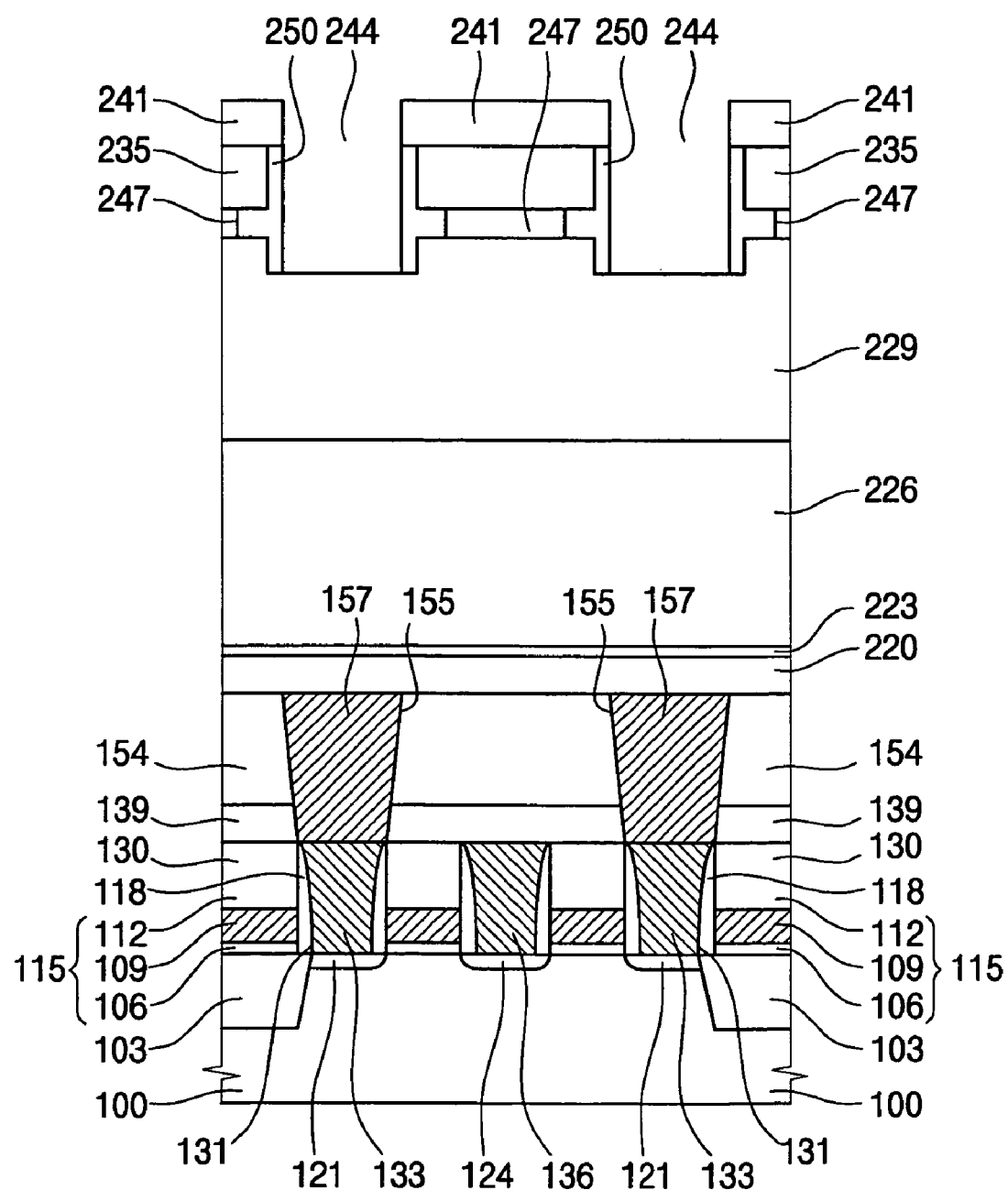
Figure 14B:
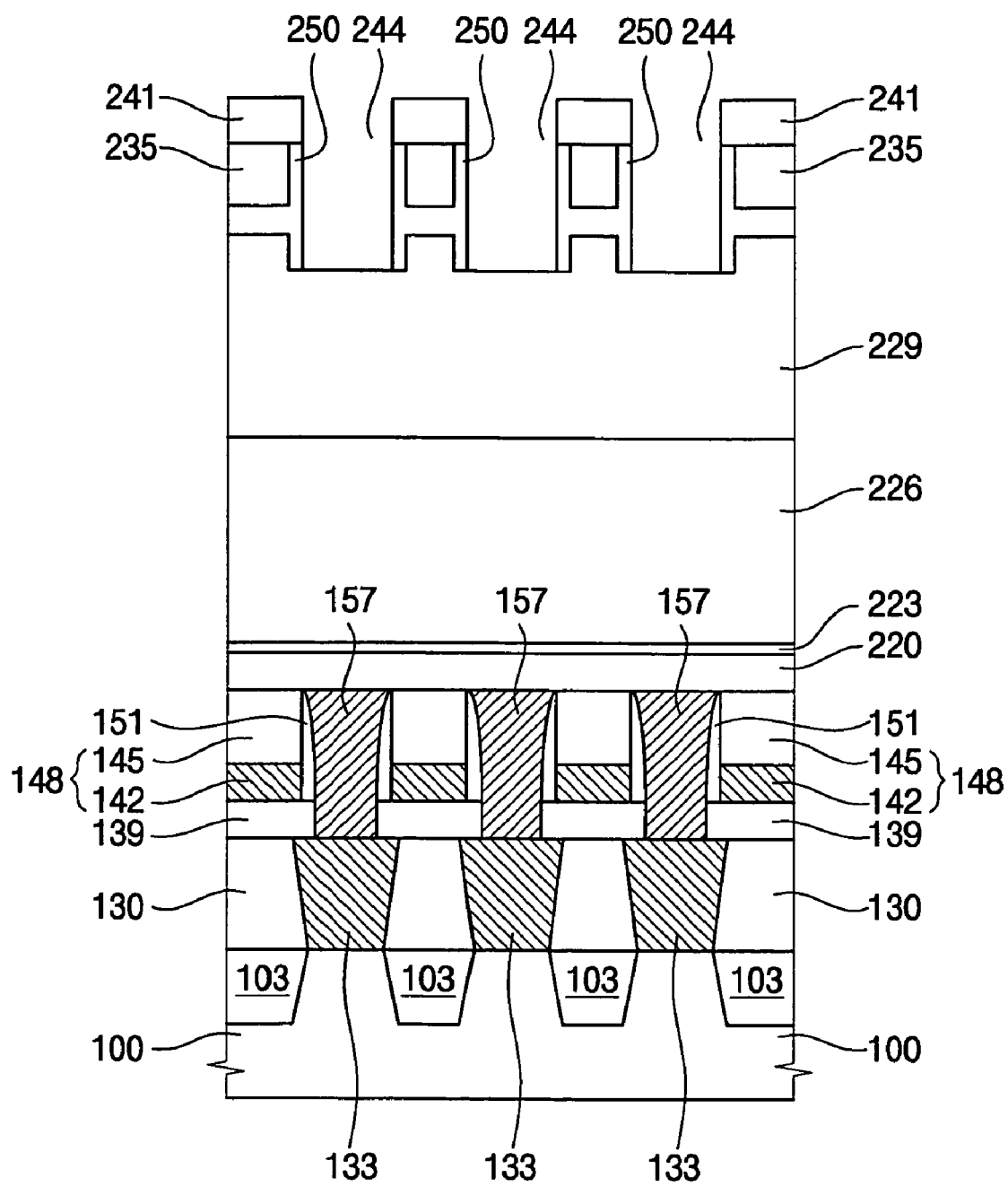

FIGS. 14A and 14B are cross sectional views of an embodiment of the present invention illustrating the formation of stabilizing members 250.

Referring to FIGS. 14A and 14B, a fourth insulation layer is formed on the storage mask pattern 241, bottoms of the second openings 244, and inner sidewalls of the second openings 244. The fourth insulation layer may be formed using material having an etching selectivity relative to oxide. For example, the fourth insulation layer includes nitride or polysilicon. The fourth insulation layer may have a thickness of about 100 to about 5,000 Å, measured from an upper face of the storage mask pattern 241.

Portions of the fourth insulation layer positioned on the storage mask pattern 241 and the bottoms of the second openings 244 are etched by an isotropic etching process, forming the stabilizing members 250 on the inner sidewalls of the second openings 244, respectively. Because the second openings 244 are connected to one another along the second direction, the stabilizing members 250 are also connected to one another along the second direction by central protruding portions thereof. However, the stabilizing members 250 are separated from one another along the first direction because the third insulation layer patterns 247 are positioned along the first direction among the stabilizing members 250. The central protruding portions of the stabilizing members 250 are horizontally formed relative to a semiconductor substrate 100. Additionally, the central protruding portions of the stabilizing members 250 are positioned along the second direction so that all of the stabilizing members 250 in the unit cell are connected to one another along the second direction by interposing the protruding portions thereof. Here, two adjacent stabilizing members 250 generally have a cross section of an H-shape including the third insulation layer pattern 247.

Figure 15A:
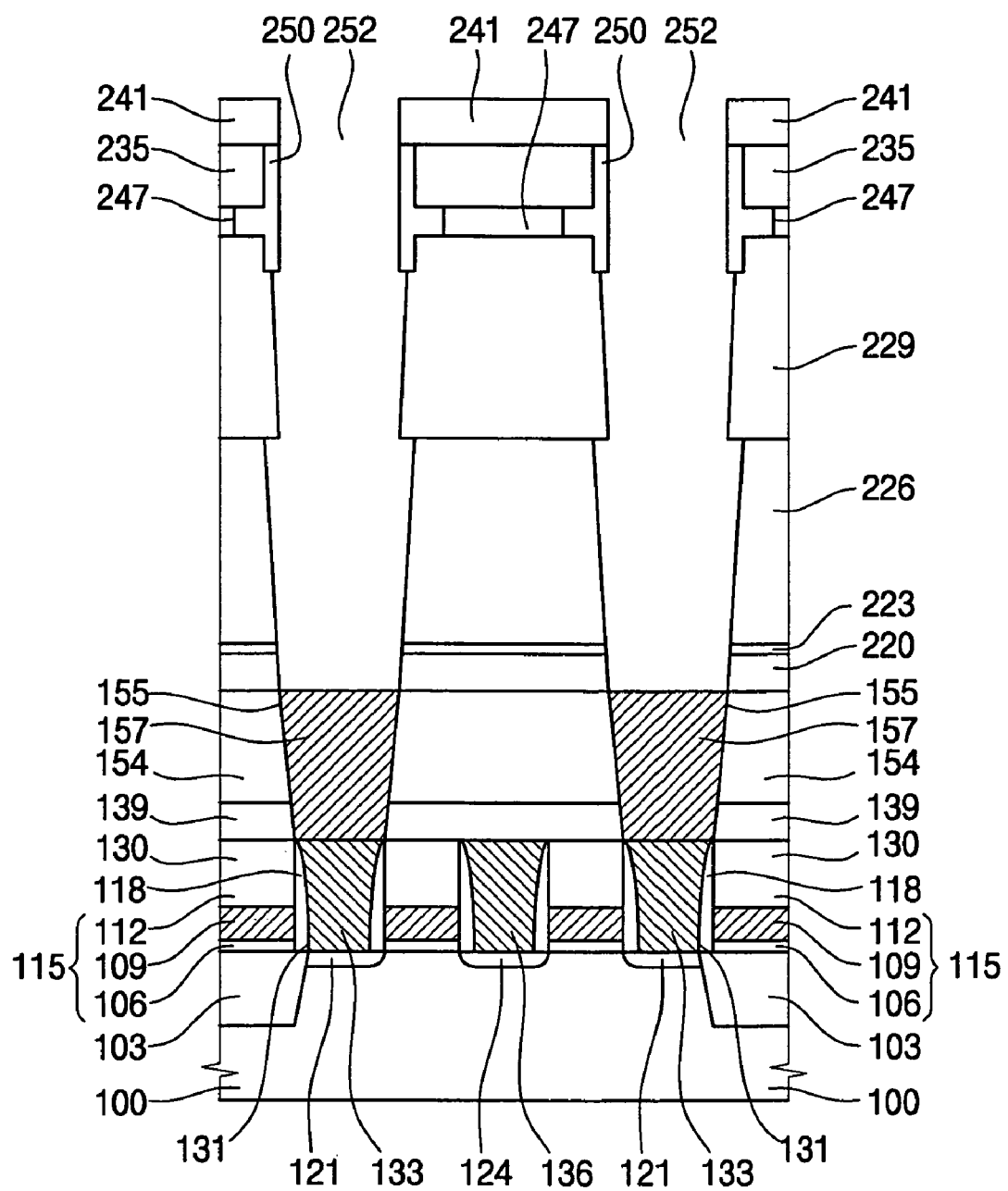
Figure 15B:
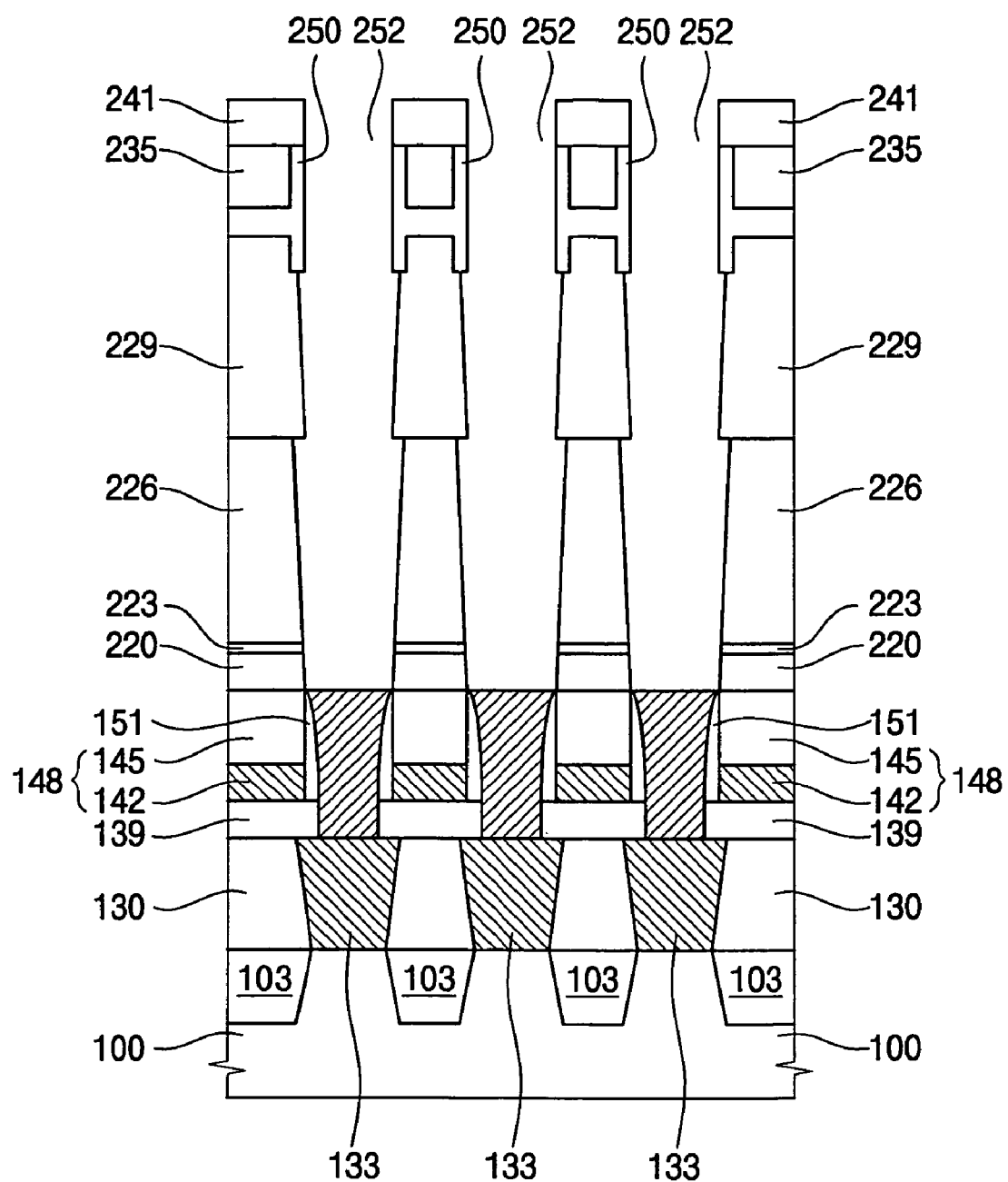

FIGS. 15A and 15B are cross sectional views of an embodiment of the present invention illustrating a step of forming storage contact holes 252.

Referring to FIGS. 15A and 15B, continuously using the storage mask pattern 241 as an etching mask, the second mold layer 229, the first mold layer 226, the etch stop layer 223, and the fourth insulating interlayer 229 are partially etched to form the storage contact holes 252 that expose the fourth pads 157, respectively. Because the first mold layer 226 is rapidly etched compared to the second mold layer 229, the storage contact holes 252 have lower portions that are wider than upper portions. Thus, the fourth pads 157 may be sufficiently exposed through the storage contact holes 252. In addition, each of the storage contact holes 252 has a cross section of a slightly sloped pyramid-shape because the first mold layer 226 has an etching rate substantially different from that of the second mold layer 229. In the etching process of forming the storage contact holes 252, the storage contact holes 252 are self-aligned relative to the stabilizing members 250.

Figure 16A:
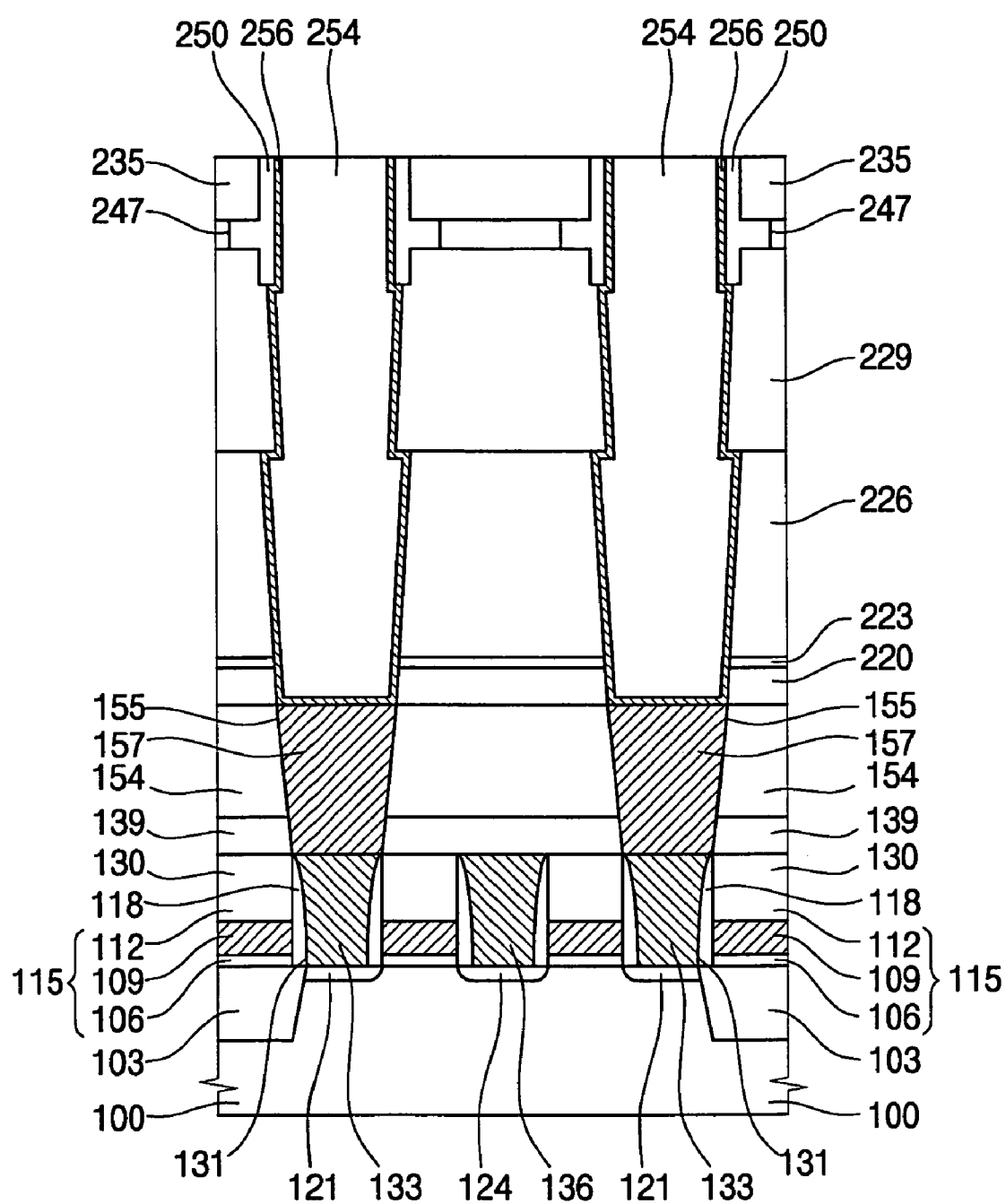
Figure 16B:
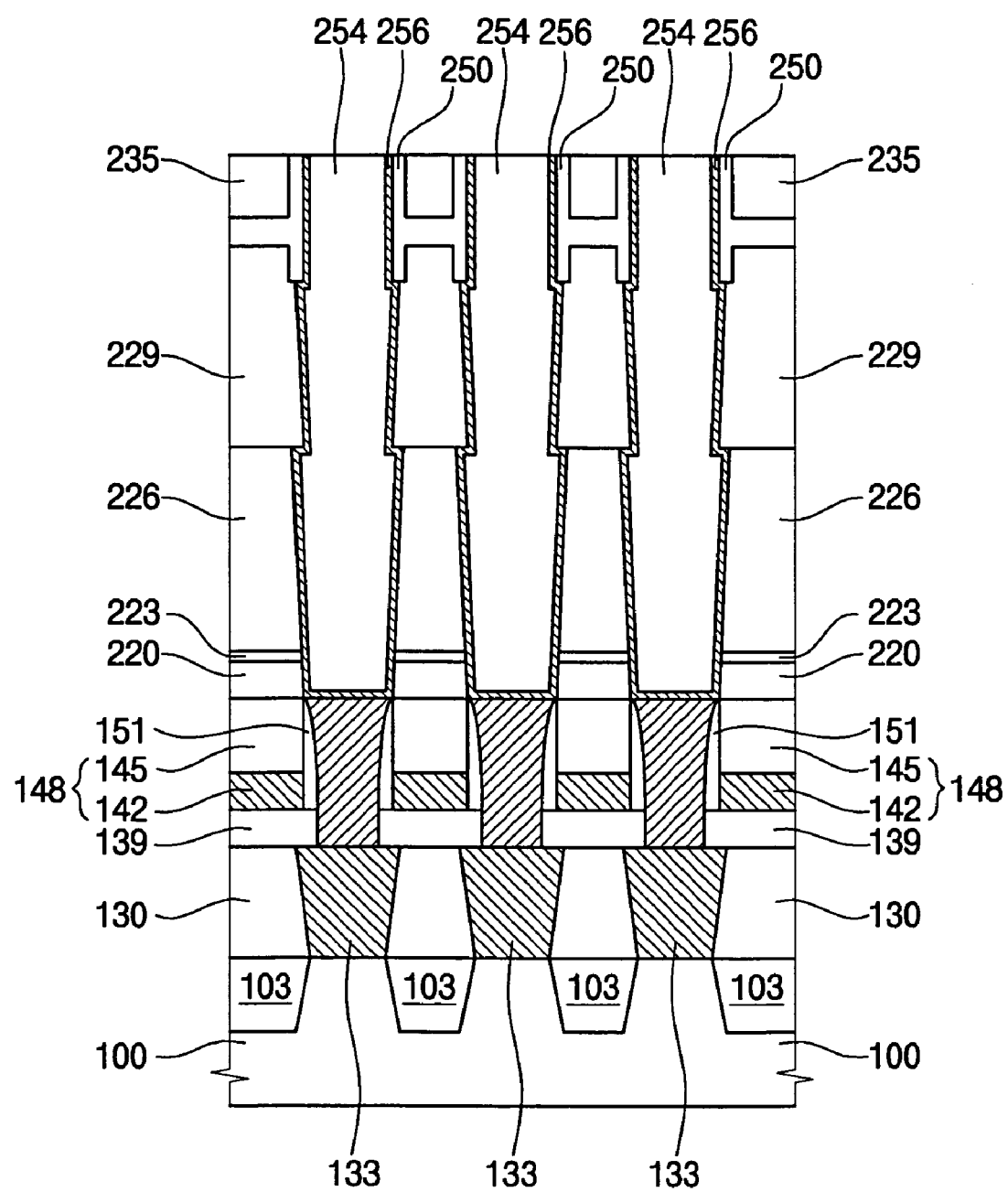

FIGS. 16A and 16B are cross sectional views of an embodiment of the present invention illustrating a step of forming the storage electrodes 256.

Referring to FIGS. 16A and 16B, a fifth conductive layer is formed on the exposed fourth pads 157, the inner sidewalls of the stabilizing members 250, inner sidewalls of the storage contact holes 252, and on storage mask pattern 241. The fifth conductive layer may be formed using conductive material such as polysilicon doped with impurities, titanium/titanium nitride, or copper. The stabilizing members 250 are attached to the fifth conductive layer. Also, the fifth conductive layer presses the inner sidewalls of the stabilizing members 250 and supports the bottoms of the stabilizing members 250. Therefore, the stabilizing members 250 are firmly fixed to the fifth conductive layer.

A sacrificial layer 254 is formed on the fifth conductive layer to fill the storage contact holes 252. The sacrificial layer 254 may be formed using oxide. For example, the sacrificial layer 254 includes USG. The sacrificial layer 254 protects the storage electrode 256 in successive etching processes of forming the storage electrodes 256.

A portion of the fifth conductive layer and the storage mask pattern 241 are etched by a CMP process, an etch back process, or a combination process of CMP and etch back until the third mold layer 235 is exposed, thereby simultaneously forming the storage electrodes 256 that contact the exposed fourth pads 157. Here, upper portions of the stabilizing members 250 and the third mold layer 235 are removed. The stabilizing members 250 encompass upper portions of the storage electrodes 256, respectively.

Figure 17A:
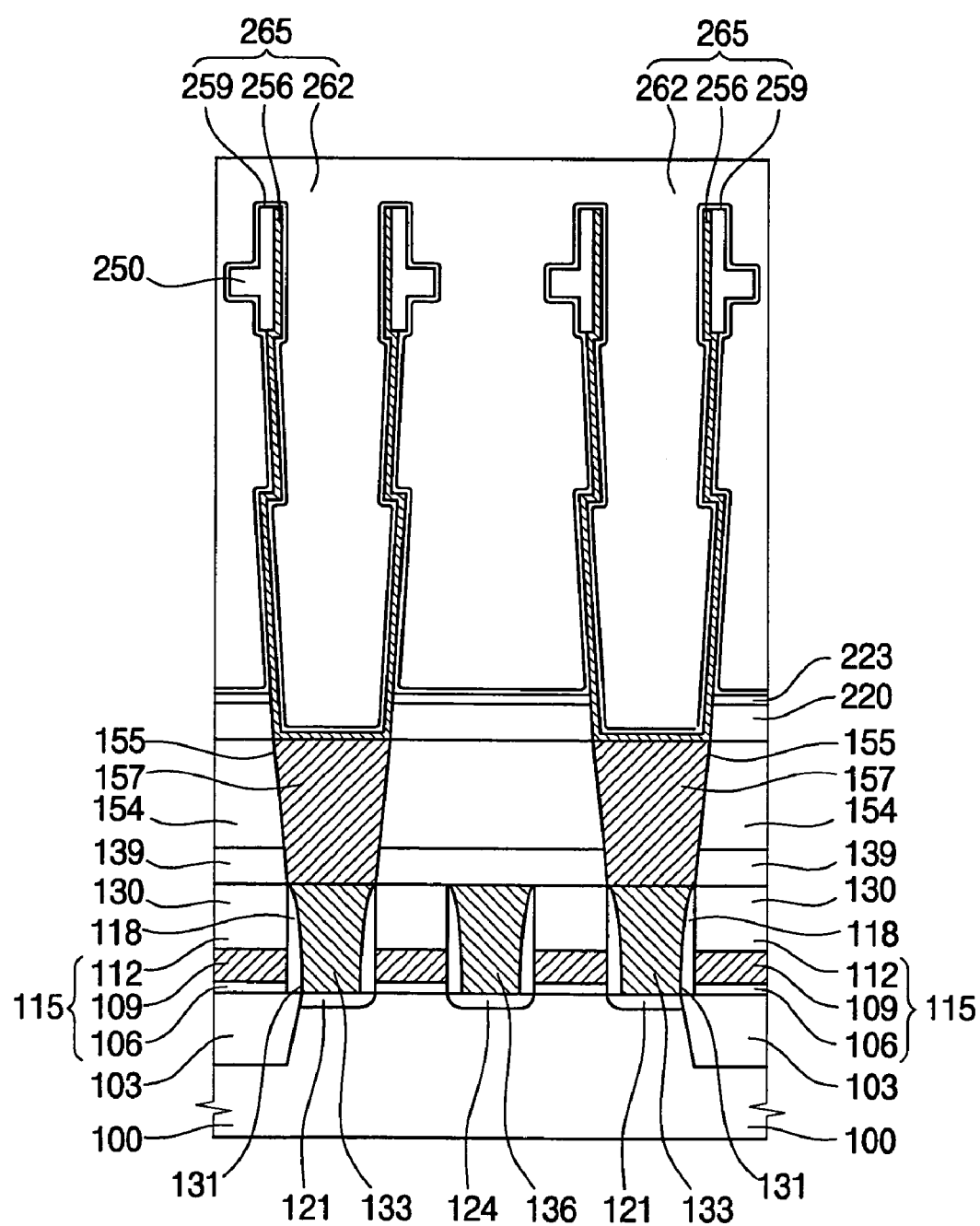
Figure 17B:
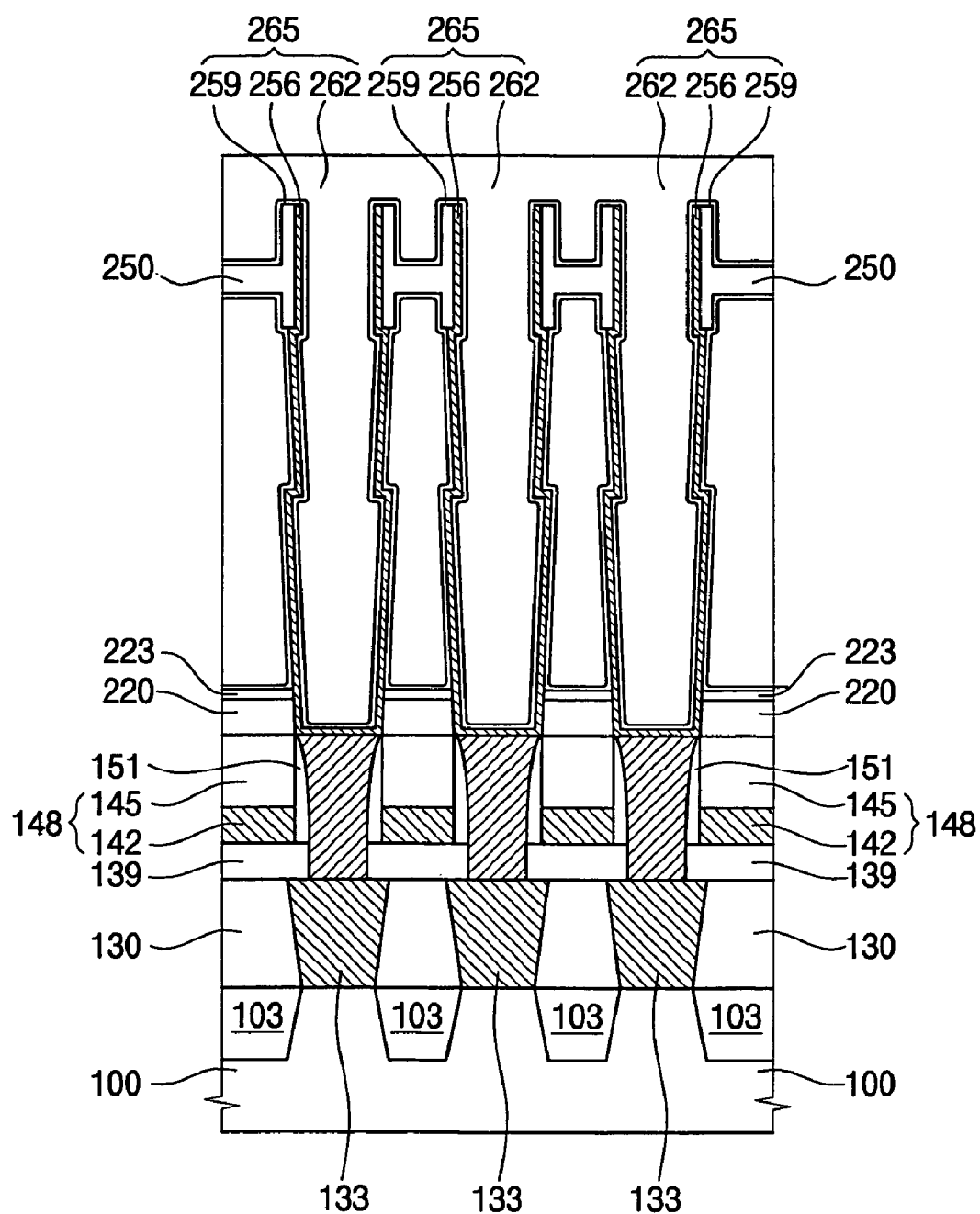

FIGS. 17A and 17B are cross sectional views of an embodiment of the present invention illustrating a step of forming capacitors 265.

Referring to FIGS. 17A and 17B, with a wet etching process using an etching solution such as LAL, or a dry etching process using an etching gas including hydrogen fluoride, the sacrificial layer 254, the third mold layer 235, the third insulation layer patterns 247, the second mold layer 229, and the first mold layer 226 are sequentially removed. Hence, the storage electrodes 256 connected to one another through the stabilizing members 250 are completed. Because the storage electrodes 256 are formed on the inner sidewalls of the storage contact holes 252 having the cross sections similar to those of pyramids, each of the storage electrodes 256 generally has a pyramid-type cross section so that the storage electrode 256 may have more enhanced structural stability.

Dielectric layers 259 and plate electrodes 262 are successively formed on the storage electrodes 256 so that capacitors 265 are formed over the semiconductor substrate 100. As described above, the capacitors 265 are separated from one another along the first direction, whereas the capacitors 265 are connected to one another along the second direction because the central protruding portions of the stabilizing members 250 are positioned along the second direction. That is, all of the capacitors 265 in the unit cell support one another to greatly improve their structural stabilities.

A fifth insulating interlayer (not shown) is formed on the capacitors 265 to electrically isolate the capacitors 265 from an upper wiring (not shown) successively formed thereon. When the upper wiring is formed on the fifth insulating interlayer, the semiconductor device including the capacitors 265 is completed.

According to the present invention, stabilizing members including central protruding portions are formed to enclose upper portions of storage electrodes in a left diagonal direction, a right diagonal direction, or both, relative to a direction that underlying structures are arranged on a semiconductor substrate. Thus, capacitors including the storage electrode and the stabilizing members may have greatly improved structural stabilities without mechanical collapse thereof, even if the capacitors have extremely high aspect ratios. As a result, a semiconductor device including the capacitors may also have improved reliability without a two-bit fail.

Having thus described exemplary embodiments of the present invention, it is to be understood that the invention defined by the appended claims is not to be limited by particular details set forth in the above description, because many apparent variations thereof are possible without departing from the spirit or scope as hereinafter claimed.

What is claimed is:

1. A method of manufacturing a semiconductor device, the method comprising:
   forming a contact region at a surface portion of a semiconductor substrate;
   forming at least one first mold layer on the substrate;
   forming a first insulation layer on the first mold layer;
   forming a second mold layer on the first insulation layer;
   forming a first opening by partially etching the second mold layer, the first insulation layer, and the first mold layer;
   forming a stabilizing member on an inner sidewall of the first opening, wherein the stabilizing member has a protruding portion to support adjacent storage electrodes;
   forming a contact hole to expose an inner sidewall of the stabilizing member and the contact region;
   forming a storage electrode to contact the contact region on the inner sidewall of the stabilizing member and an inner sidewall of the contact hole;
   forming a dielectric layer on the storage electrode; and
   forming a plate electrode on the dielectric layer.

2. The method of claim 1, wherein the first insulation layer has an etching selectivity relative to the first and the second mold layers.

3. The method of claim 2, wherein the first insulation layer is rapidly etched in comparison with the first and second mold layers using an etching solution including hydrogen fluoride or an etching solution including ammonium hydroxide, hydrogen peroxide, and deionized water.

4. The method of claim 2, wherein the first mold layer has an etching selectivity relative to the second mold layer.

5. The method of claim 1, wherein forming the stabilizing member comprises:
   forming a mask layer on the second mold layer;
   patterning the mask layer to form a mask on the second mold layer;
   partially etching the second mold layer, the first insulation layer, and the first mold layer using the mask to form the first opening; and
   forming a second opening by extending the first opening.

6. The method of claim 5, wherein the first opening is formed by an anisotropic etching process, and the second opening is formed by an isotropic etching process.

7. The method of claim 5, wherein the second opening is partially connected to an adjacent second opening along a right diagonal direction, left diagonal direction, or both, relative to the contact region.

8. The method of claim 7, wherein a portion of the first insulation layer is completely removed along the right diagonal direction, left diagonal direction while the second opening is formed.

9. The method of claim 5, wherein the forming the stabilizing member further comprises:
   forming a second insulation layer on the mask and an inner sidewall and a bottom of the second opening; and
   partially etching the second insulation layer to form the stabilizing member on the inner sidewall of the second opening.

10. The method of claim 9, wherein the first insulation layer has an etching selectivity relative to the second insulation layer.

11. The method of claim 5, wherein forming the storage electrode comprises:
    forming a conductive layer on the mask, an inner sidewall of the stabilizing member, and an inner sidewall of the contact hole; and
    removing the mask and a portion of the conductive layer formed on the mask.

12. The method of claim 11, wherein forming the storage electrode further comprises forming a sacrificial layer on the conductive layer to fill the contact hole.

* * * * *